United States Patent
Okazawa et al.

(10) Patent No.: US 6,812,537 B2
(45) Date of Patent: Nov. 2, 2004

(54) MAGNETIC MEMORY AND METHOD OF OPERATION THEREOF

(75) Inventors: Takeshi Okazawa, Tokyo (JP); Katsumi Suemitsu, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/141,602

(22) Filed: May 8, 2002

(65) Prior Publication Data

US 2002/0167033 A1 Nov. 14, 2002

(30) Foreign Application Priority Data

May 9, 2001 (JP) ........................................ 2001-139382

(51) Int. Cl.[7] .......................... H01L 29/82; H01L 43/00
(52) U.S. Cl. ................. 257/421; 257/295; 257/E27.006
(58) Field of Search ................................ 257/421, 295, 257/E27.006

(56) References Cited

U.S. PATENT DOCUMENTS

| 5,953,248 A | * | 9/1999 | Chen et al. | 365/158 |
| 5,959,880 A | | 9/1999 | Shi et al. | |
| 6,081,446 A | * | 6/2000 | Brug et al. | 365/171 |
| 6,166,948 A | * | 12/2000 | Parkin et al. | 365/173 |
| 6,269,018 B1 | * | 7/2001 | Monsma et al. | 365/145 |
| 6,404,673 B1 | * | 6/2002 | Matsui | 365/173 |
| 2002/0036331 A1 | * | 3/2002 | Nickel et al. | 257/421 |

FOREIGN PATENT DOCUMENTS

JP 11-176149 7/1999

OTHER PUBLICATIONS

Korean Office Action dated Apr. 28, 2004 with Translation

* cited by examiner

*Primary Examiner*—David Nelms
*Assistant Examiner*—Tu-Tu Ho
(74) *Attorney, Agent, or Firm*—Katten Muchin Zavis Rosenman

(57) ABSTRACT

A magnetic memory according to the present invention comprises: a single magnetic memory cell having at least first to third magnetic layers, a first tunnel insulating layer between the first and second magnetic layers and a second tunnel insulating layer between the second and third magnetic layers. The resistance between the first and third magnetic layers when magnetization of the first and second magnetic layers are in opposite directions is different from the resistance between the second and third magnetic layers when magnetization of the second and third magnetic layers are in opposite directions. Multiple data are therefore stored into the memory cell.

28 Claims, 16 Drawing Sheets

Fig. 1
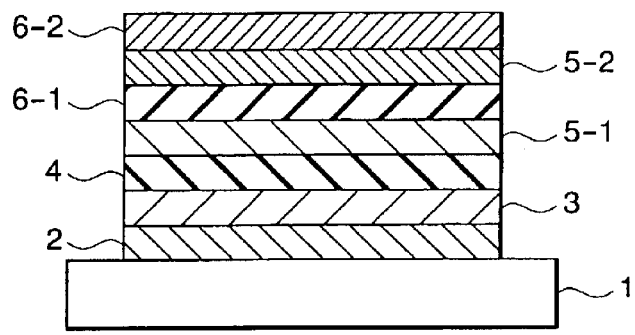
Fig. 2
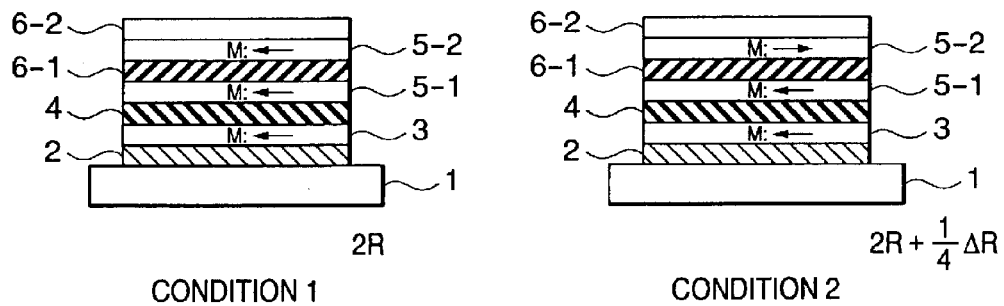
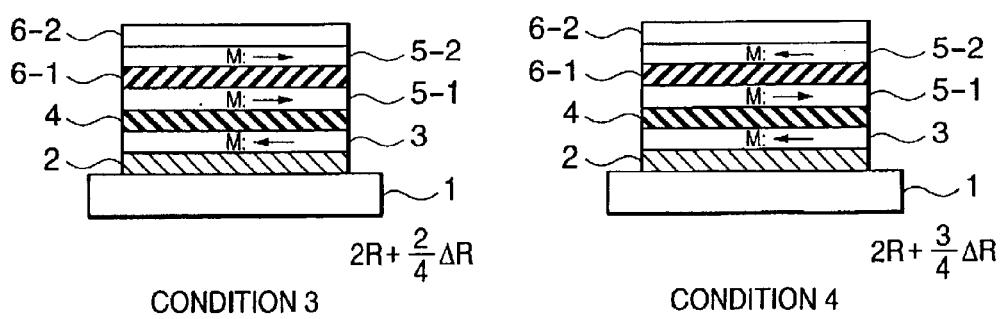

Fig. 3
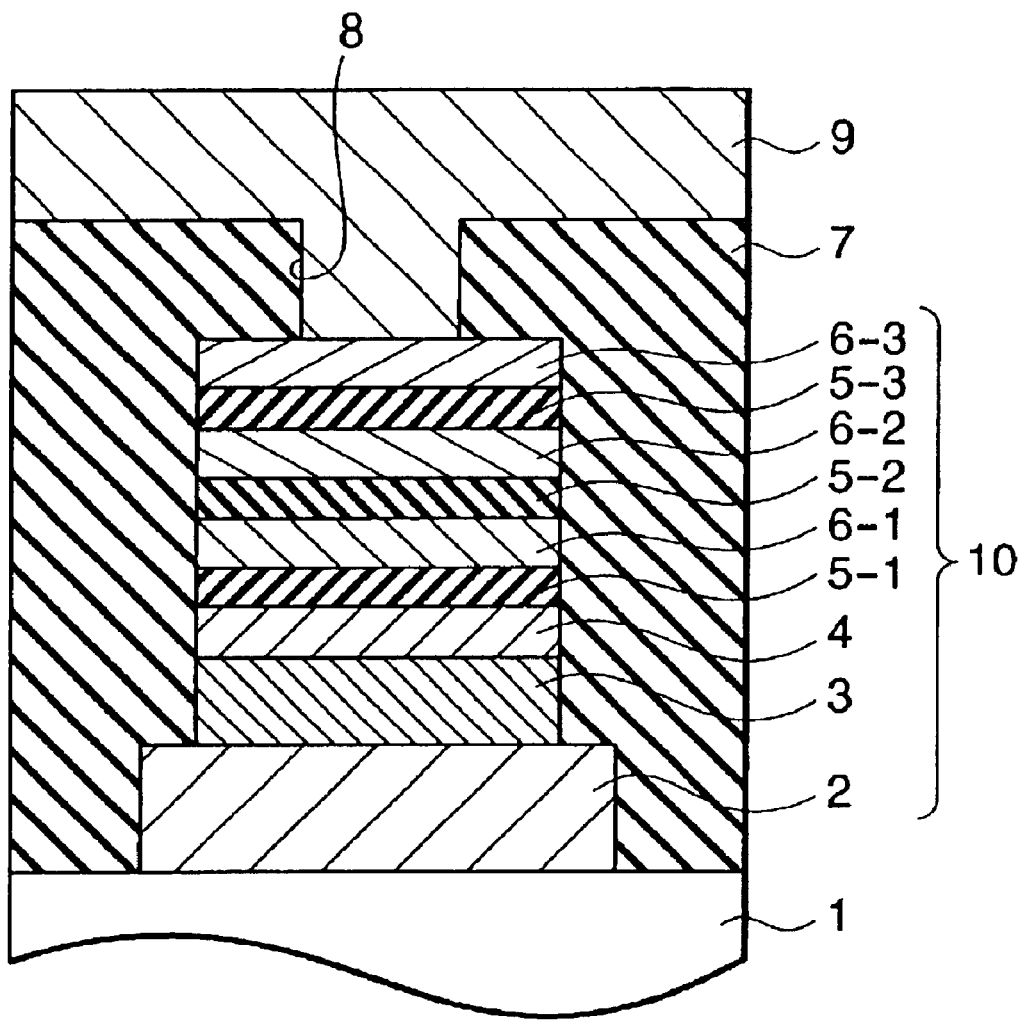
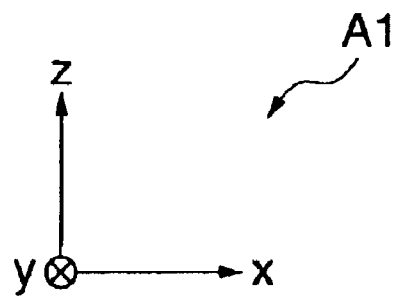

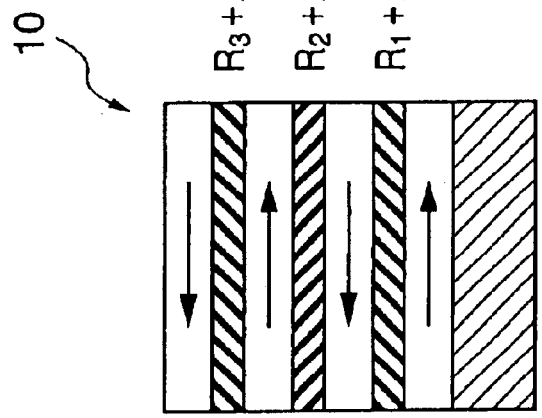
Fig. 5A
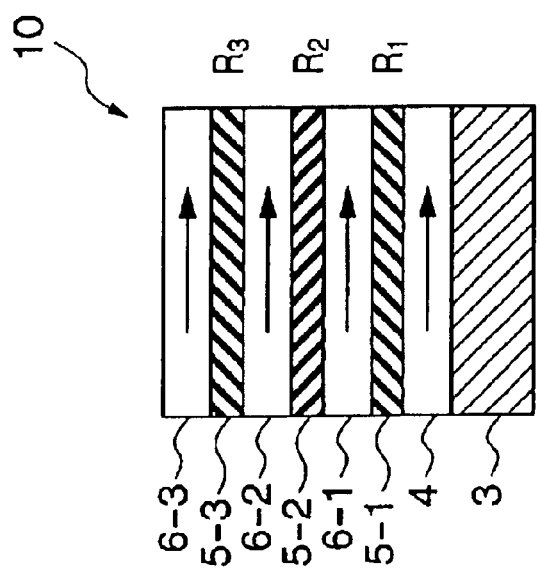
Fig. 5B
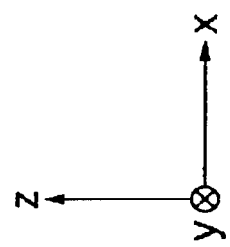

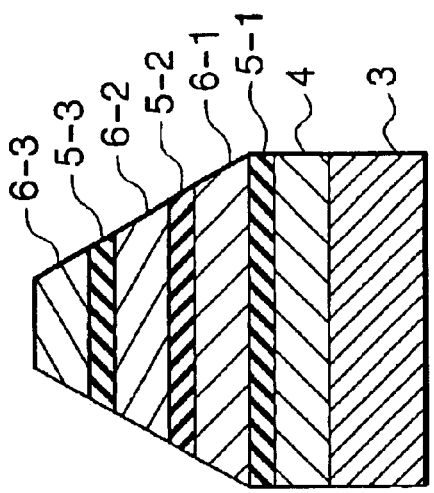
Fig. 7C
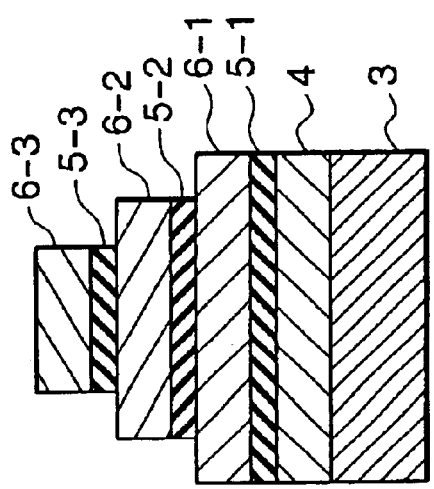
Fig. 7B
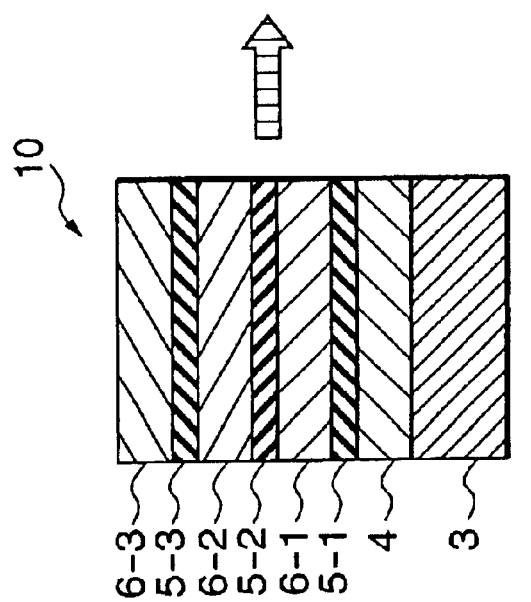
Fig. 7A
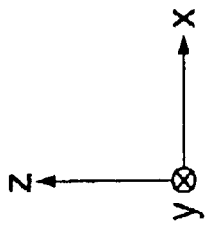

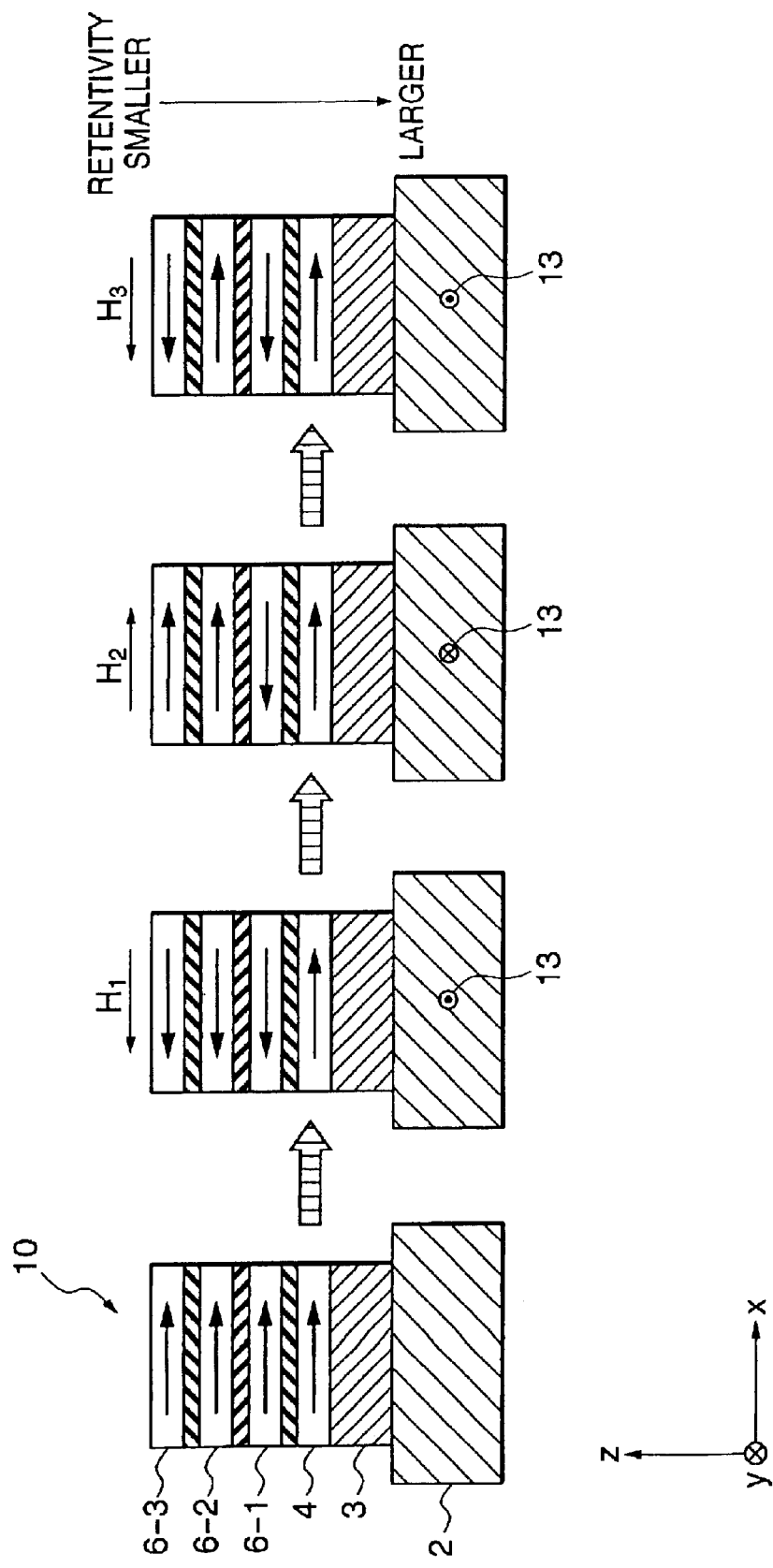

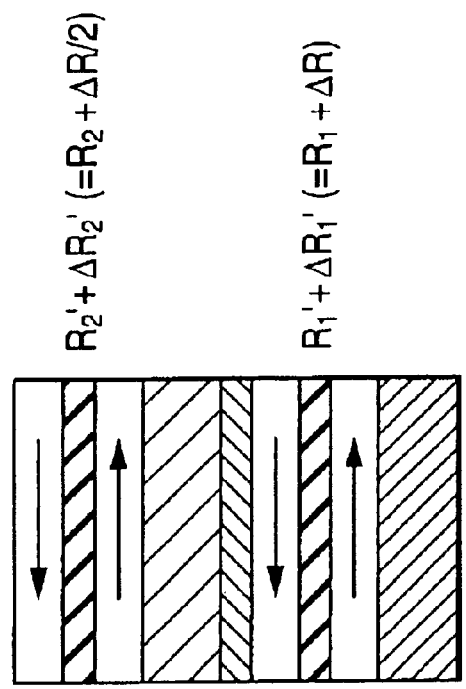
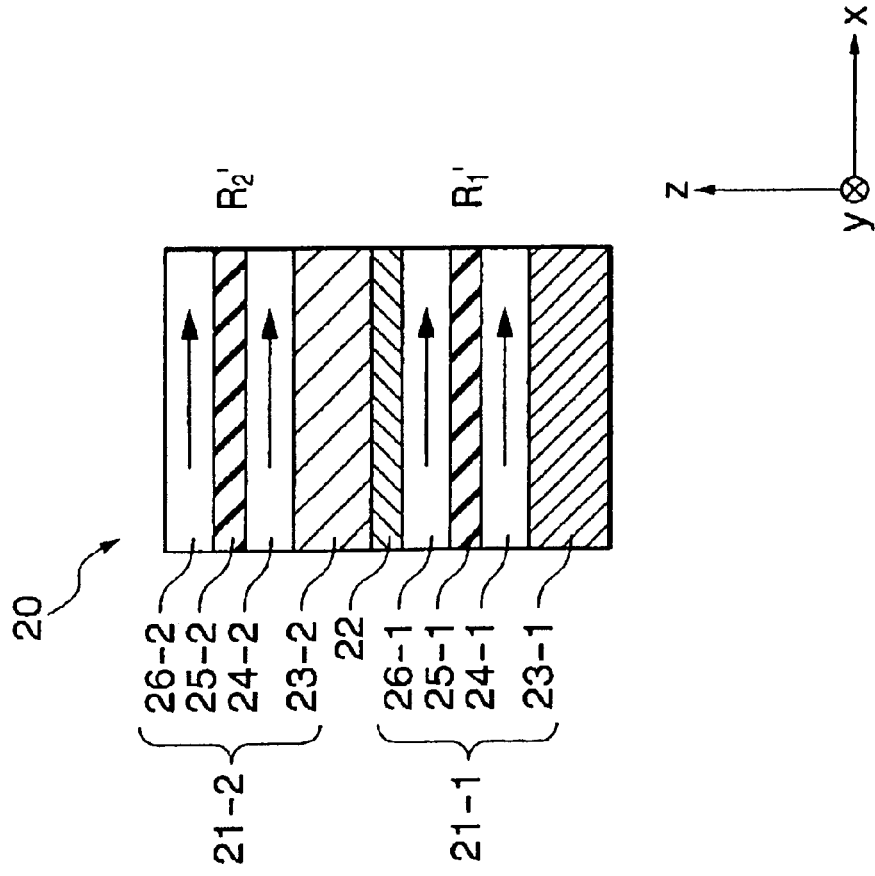

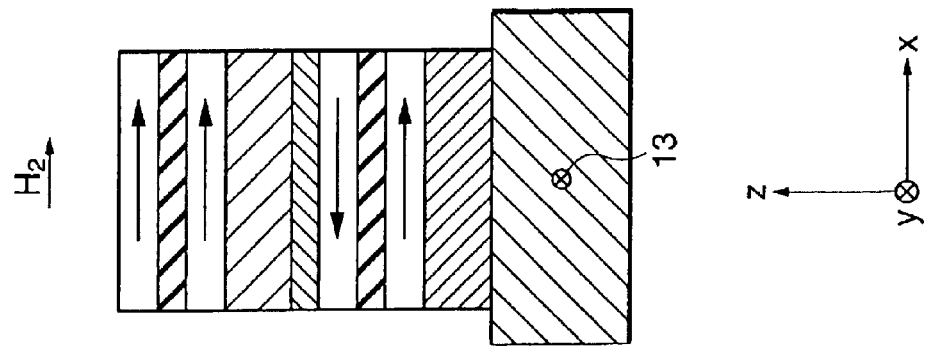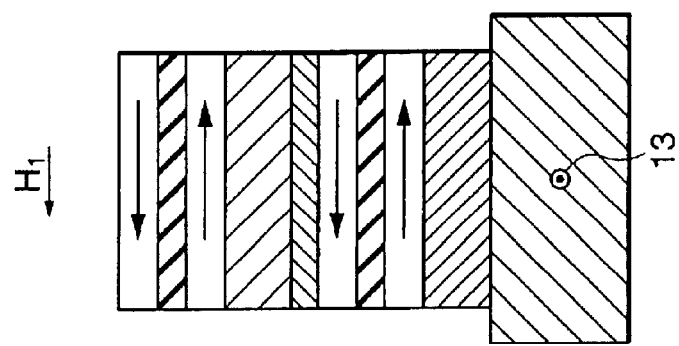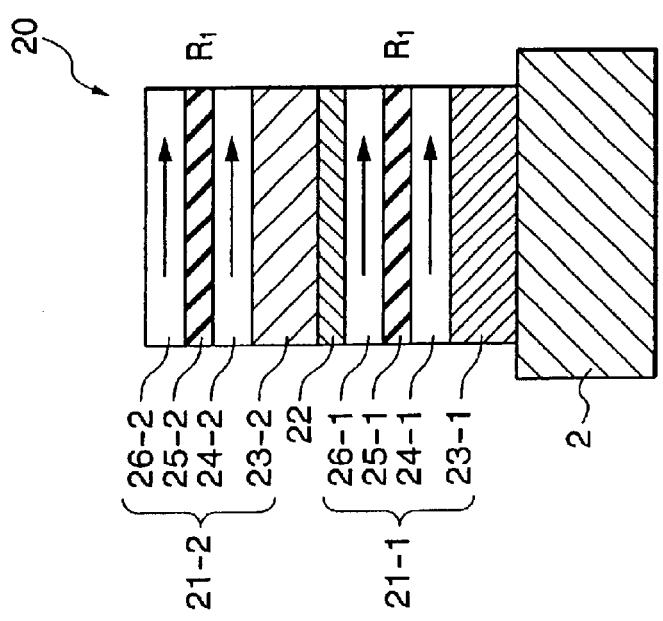

MAGNETIC MEMORY AND METHOD OF OPERATION THEREOF

BACKGROUND OF THE INVENTION

1. Field of the Invention

The present invention relates to a magnetic memory device and more particularly to a magnetic memory device which is constructed to store data of multiple bits in a single memory cell.

2. Description of Related Arts

Magnetic Random Access Memory (hereinafter referred to as MRAM) is known as one of the semiconductor memories storing data in a nonvolatile manner. In MRAM, ferromagnetic films are integrated. Magnetization or magnetic vector of the ferromagnetic material is set to correspond to either "1" or "0", and, in the case of MRAM, digital data is stored in a nonvolatile manner. That is, vectors in magnetic layers represent two states of magnetization within cell.

Technology for storing multivalued information in a single memory cell of magnetic memory is being developed in an attempt to expand memory capacity. Such magnetic memory has been disclosed in Japanese Patent Application Laid-open No. Hei 11-176149 though this publication teaches GMR memory cell which can be set multiple value. FIG. 16 shows the cross sectional structure of the magnetic memory. The magnetic memory comprises a substrate 101. Upon substrate 101, there is formed, in order, a lower electrode 102, a first magnetic layer 103, a first non-magnetic spacer layer 104, a second magnetic layer 105, a second non-magnetic spacer layer 106, a third magnetic layer 107, and an upper electrode 108. As shown in FIGS. 17 through 19, magnetization direction of the multiple magnetic layers is controlled individually. The resistance value between the lower electrode 102 and upper electrode 108 varies in accordance with the combination of magnetization directions. That is, the combination has three type, one of which is that all layers 103, 105 and 107 are magnetized in the same direction (FIG. 17, all left direction), another of which is that the magnetized direction of adjacent layers 103, 105, 107 is only one different (FIG. 19: 103, left magnetized direction, 105 right magnetized direction and 107 right magnetized direction), the other of which is that the magnetized direction of adjacent layers is all different (FIG. 18). It is thus possible to store three information in a single memory cell. If number of magnetic layers is n (n>=3) in the solo memory cell, the cell can store n value.

SUMMARY OF THE INVENTION

According to the present embodiments, Magnetic memory as claimed in the present invention comprises: first through n-th tunnel insulating layers (n being a natural number of 2 or greater) and first through (n+1)-th magnetic layers, each respectively having first through (n+1)-th magnetization. The i-th tunnel insulating layer (i being an arbitrary integer of 1 or greater but no greater than n) of the first through n-th tunnel insulating layers are provided between the i-th magnetic layer and the (i+1)-th magnetic layer of the first through (n+1)-th magnetic layers Here, the i-th resistance between the i-th magnetic layer and (i+1)-th magnetic layer is $R_i$ when the i-th magnetization and the (i+1)-th magnetization of the first through (n+1)-th magnetization are in the same direction, and the i-th resistance is $R_i+\Delta R_i$ when the i-th magnetization and the (i+1)-th magnetization are in opposite directions. This makes it possible to store at least n+1 values or more as data in this magnetic memory.

At this point, it is preferable that each of $\Delta R_1, \Delta R_2, \ldots, \Delta R_n$ be different. In this magnetic memory, there can be obtained at least $\{(n^2+n+2)/2\}$ resistance values differing with each other between the first magnetic layer and the (n+1)-th magnetic layer depending on the direction of the first through (n+1)-th magnetization. In this magnetic memory, at least $\{(n^2+n+2)/2\}$ values or more can be stored as data.

In this magnetic memory, it is preferable that the sum of any progression generated from elements if the group consisting of, $\Delta R_1, \Delta R_2, \ldots, \Delta R_n$ be different from each other. This makes it possible in this magnetic memory for the resistance value between the first magnetic layer and the (n+1)-th magnetic layer to beat least $2^n$ different values depending on the direction of the first through the (n+1)-th magnetization. In this magnetic memory, at least $2^n$ values or more can be stored as data.

Also, it is preferable that each of $\Delta R_1, \Delta R_2, \ldots, \Delta R_n$ be substantially equal to any of $\Delta R, \Delta R/2, \Delta R/2^2, \ldots, \Delta R/2^{n-1}$ given that $\Delta R$ is a predetermined resistance. This causes the resistance value between the first magnetic layer and the (n+1)-th magnetic layer to vary linearly depending on the direction of the first through (n+1)-th magnetization in this magnetic memory.

At this point, it is preferable that the magnetic material comprising the first through (n+1)-th magnetic layers be selected so as for each of the above mentioned $\Delta R_1$, $\Delta R_2, \ldots, \Delta R_n$ to be substantially equal to any of $\Delta R, \Delta R/2, \Delta R/2^2, \ldots,$ or $\Delta R/2^{n-1}$.

In addition, it is preferable that the film thickness of the first through n-th tunnel insulating layers be set so as for each of these $\Delta R_1, \Delta R_2, \ldots, \Delta R_n$ to be substantially equal to any of $\Delta R, \Delta R/2, \Delta R/2^2, \ldots, \Delta R/2^{n-1}$.

In addition, it is preferable that the material comprising the first through n-th tunnel insulating layers be set so as for each of the above mentioned $\Delta R_1, \Delta R_2, \ldots, \Delta R_n$ is substantially equal to either one of $\Delta R, \Delta R/2, \Delta R/2^2, \ldots, \Delta R/2^{n-1}$.

In addition, it is preferable that the area where the i-th tunnel insulating layer comes into contact with the i-th magnetic layer and the area where the i-th tunnel insulating layer comes into contact with the (i+1)-th magnetic layer be set so as for each of these $\Delta R_1, \Delta R_2, \ldots, \Delta R_n$ to be substantially equal to any of $\Delta R, \Delta R/2, \Delta R/2^2, \ldots, \Delta R/2^{n-1}$.

In addition, it is preferable that the film quality of the first through n-th tunnel insulating layers be set so as for each of the these $\Delta R_1, \Delta R_2, \ldots, \Delta R_n$ to be substantially equal to any of $\Delta R, \Delta R/2, \Delta R/2^2, \ldots, \Delta R/2^{n-1}$.

In addition, it is preferable that each of these $\Delta R_1, \Delta R_2, \ldots, \Delta R_n$ be substantially equal to any of $\Delta R/n, 2\Delta R/n, 3\Delta R/n, \ldots, (n-1) \Delta R/n, \Delta R$ given that $\Delta R$ is a predetermined resistance. This makes it possible for $\{(n^2+n+2)/2\}$ values to be stored as data in this magnetic memory depending on the direction of first through (n+1)-th magnetization. Moreover, in this magnetic memory, the resistance value between the first magnetic layer and the (n+1)-th magnetic layer varies linearly.

In addition, it is preferable that the direction of the first magnetization be fixed.

At this point, it is preferable that the magnetic memory further comprise an antiferromagnetic layer connected to the first magnetic layer and that the direction of the first magnetization be fixed due to the interaction with the antiferromagnetic layer.

As to aspect of the embodiments of the present invention, a magnetic memory as claimed in the present invention comprises:

(a) a step of directing in a first direction the j-th though the (n+1)-th magnetization (j being an integer of 1 or greater but no greater than n) of the first through (n+1)-th magnetization; and (b) a step of directing a (j+1)-th through (n+1)-th magnetization of the first through (n+1)-th magnetization, after the (a) step, either in the first direction or a second direction, which is substantially opposite the first direction.

As to another aspect of the embodiments of the present invention, a magnetic memory comprises a memory cell having at least a first magnetic layer, a second magnetic layer and third magnetic layer. In this magnetic memory, the resistance between the first magnetic layer and second magnetic layer when the magnetization or magnetic vector of the first magnetic layer and magnetization of second magnetic layer are aligned in opposite directions or antiparallel orientation, and the resistance between the second magnetic layer and third magnetic layer when the magnetization of the second magnetic layer and the magnetization of the third magnetic layer are in opposite directions, are different.

BRIEF DESCRIPTION OF THE DRAWINGS

FIG. 1 is a cross-sectional view showing a structure of a magnetic memory cell according to a first embodiment;

FIG. 2 is cross-sectional views for explaining magnetic vectors of the cell shown in FIG. 1;

FIG. 3 is a cross-sectional view showing a magnetic memory cell according to a second embodiment;

FIGS. 5A and 5B show the respective resistance values of tunnel insulating layers in the film thickness direction;

FIGS. 7A to 7C show method of adjusting contact area of tunnel insulating layers with fixed magnetic layer 4 and free magnetic layers;

FIGS. 8A to 8D show operation to write data into memory cell of the magnetic memory according to the second embodiment;

FIGS. 12A and 12B show the respective resistance values of tunnel insulating layers in the film thickness direction;

FIGS. 13A–13C to shows an operation to write data into memory cell 30 of the magnetic memory according to the fifth embodiment;

DETAILED DESCRIPTION OF THE PREFERRED EMBODIMENTS

Figure 4:
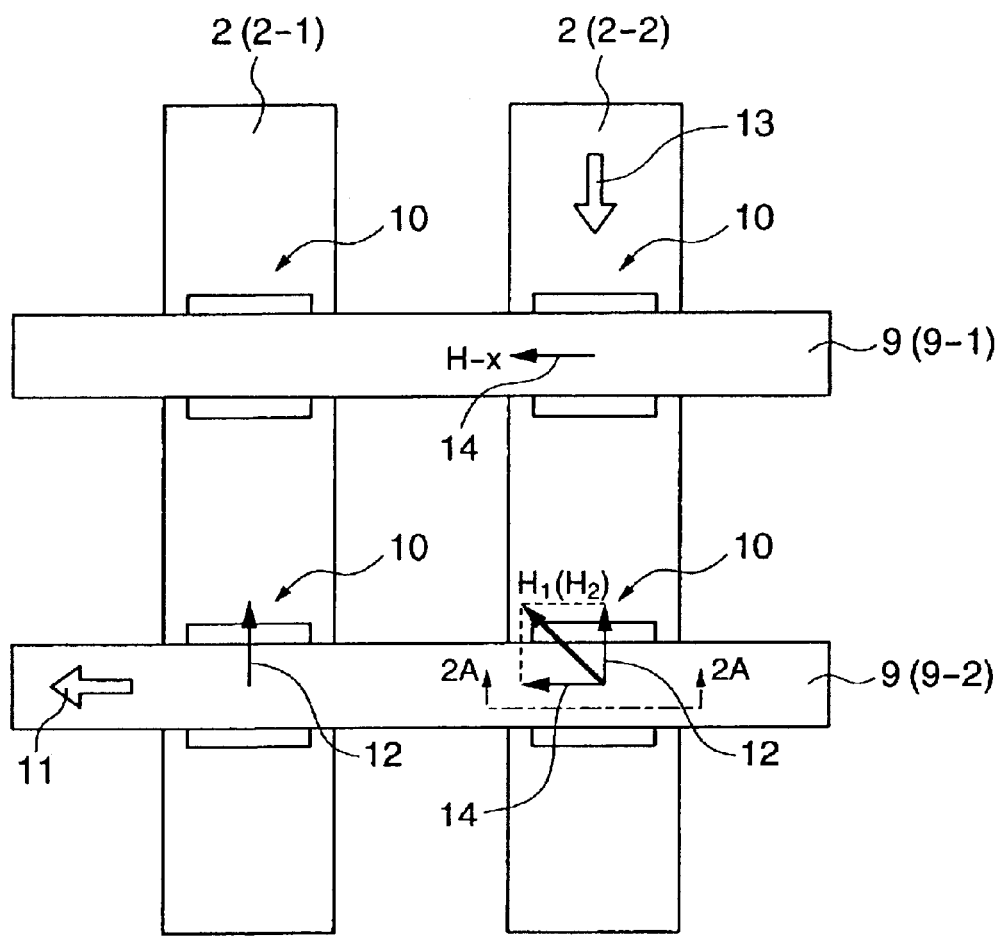
FIG. 4 is a plan view showing the magnetic memory cells according to the second embodiment.

Various embodiments of the present invention will now be described in detail with reference to a number of drawings.

Referring to FIG. 1, a magnetic cell according to the present invention is shown. The cell includes a pinned magnetic layer 3, free magnetic layers 5-1 and 5-2. Tunnel insulating layers 4, 6-1 are inserted between magnetic layers 3, 5-1, 5-2. Lower conductive layer 2 as electrode is formed under the pinned magnetic layer 3 and upper conductive layer 6-2 is formed on the free magnetic layer 5-2. Substrate 1 is formed under the lower electrode 2. Coercive force of the free magnetic layer 5-1 is different from that of the free magnetic layer 5-2. For example, coercive force of the free magnetic layer 5-1 is stronger than that of the free magnetic layer 5-2. That is, the free magnetic layer 5-2 easily changes its magnetization or magnetic vector with weaker magnetic field, compared with the free magnetic layer 5-1. The magnetic vector of this multi-layer magnetic cell is aligned along one axis, for example, x-axis. The resistance value between the upper and lower electrodes 2, 6-2 is established, based on the direction (+x or −x) of each magnetic vector of the free magnetic layers 5-1 and 5-2.

FIG. 2 illustrates resistance values between the electrodes 2, 6-2 of the cell under four conditions. When reading out, the upper electrode 6-2 as a word line is supplied to a current. The current flows from the upper electrode 6-2 to the lower electrode 2 through layers 5-2, 6-1, 5-1, 4 and 3. The magnetic vector of each magnetic layer controls the current volume. First condition corresponds to that magnetic vectors of the layers 3, 5-1, 5-2 are the same. The resistance value is defined in 2R under the first condition. Second condition corresponds to that magnetic vectors of the layers 3, 5-1 are the same and the magnetic vector of the layer 5-2 is the opposite. The resistance value is defined in 2R+ΔR/4 under the second condition. Third condition corresponds to that magnetic vectors of the layers 5-1, 5-2 are the same and the magnetic vector of the layer 3 is the opposite. The resistance value is defined in 2R+2ΔR/4 under the third condition. Fourth condition corresponds to that magnetic vectors of the layers 3, 5-2 are the same and the magnetic vector of the layer 5-1 is the opposite. The resistance value is defined in 2R+3ΔR/4 under the fourth condition.

Under the above, by the location of the magnetic layer, the resistance value changes. This is able to achieve by changing materials every magnetic layer or changing materials, forming method, thickness, size of every tunnel insulating layers.

This embodiment can store 4 value in the solo cell. On the other hand, the related art can store 3 value in the single cell. If number of the sum of the pinned and free magnetic layers is n, the embodiment can store $2^{n-1}$ (n>=3) value in the single cell. That is, if number of the free magnetic layers is n, this embodiment can store $2^n$ (n>=2) value in the single cell. On the other hand, when number of the sum of the pinned and free magnetic layers is n, the related art can merely store n value (n>=3) in the single cell. In other words, when number of the free magnetic layer is n, the related art can store n+1 (n>=2) value in the single cell. This embodiment is therefore superior to the related art.

FIG. 3 is a sectional view showing a magnetic memory structure according to a second embodiment of the present invention. FIG. 4 is a plan view showing the structure of the memory in FIG. 3. FIG. 31 is a sectional view of the cross section, 2A—2A, in FIG. 4. Symbol A1 in FIG. 1 and symbol A2 in FIG. 2 show a predetermined coordinate system.

This magnetic memory is provided with a bit line 2 and a word line 9. The bit line 2 is formed on a substrate 1. On the upper surface of bit line 2, there is formed, in order, an antiferromagnetic layer 3, a fixed magnetization (pined ferromagnetic) layer 4, a tunnel insulating layer 5-1, a free magnetization (free ferromagnetic) layer 6-1, a tunnel insulating layer 5-2, a free magnetic layer 6-2, a tunnel insulating layer 5-3, and a free magnetization 6-3. Memory cell 10 is constructed from the layers 3, 4, 5-1 to 5-3 and 6-1 to 6-3. The bit line 2 is formed with a conductor such as aluminum or copper. Electric current is flowed in bit line 2 in either the +y axis direction or −y axis direction. The Fixed magnetic layer 4, free magnetic layer 6-1, free magnetic layer 6-2, and free magnetic layer 6-3 are respectively formed from a ferromagnetic material. The magnetization of fixed magnetic layer 4 is fixed or pinned upon interaction with the antiferromagnetic layer 3. On the other hand, the magnetization of free magnetic layer 6-1, free magnetic layer 6-2, and free magnetic layer 6-3 is reversible. The direction of the magnetization of free magnetic layer 6-1, free magnetic layer 6-2, and free magnetic layer 6-3 is in either the +x axis direction or −x axis direction upon application of a magnetic field. 8 ($=2^3$) values can be stored as data in memory cell 10 corresponding to the magnetization directions of free magnetic layer 6-1, free magnetic layer 6-2, and free magnetic layer 6-3.

Magnetization of free magnetic layer 6-1, free magnetic layer 6-2, and free magnetic layer 6-3 is reversed with the magnetic field produced by the electric current flowing to bit line 2. When electric current flows to bit line 2 in either the +y axis direction or the −y axis direction, a magnetic field is respectively applied to free magnetic layer 6-1, free magnetic layer 6-2, free magnetic layer 6-3 in either the +x axis direction or the −x axis direction. Magnetization of free magnetic layer 6-1, free magnetic layer 6-2, and free magnetic layer 6-3 is reversed by the magnetic field in either the +x axis direction or the −x axis direction.

Free magnetic layer 6-1, free magnetic layer 6-2, and free magnetic layer 6-3 are formed so that closer to bit line 2 the higher the coercive force is. In other words, free magnetic layer 6-1, free magnetic layer 6-2, and free magnetic layer 6-3 are formed so that the coercive force of free magnetic layer 6-3 is lower than the coercive force of free magnetic layer 6-2, and also the coercive force of free magnetic layer 6-2 is lower than the coercive force of free magnetic layer 6-1. The coercive force of free magnetic layer 6-1, free magnetic layer 6-2, and free magnetic layer 6-3 is adjustable with the type and film thickness of magnetic material comprising free magnetic layer 6-1, free magnetic layer 6-2, and free magnetic layer 6-3.

Tunnel insulating layer 5-1, tunnel insulating layer 5-2, and tunnel insulating layer 5-3 are formed with an insulator such as alumina ($Al_2O_3$) or hafnium oxide. The film thickness of tunnel insulating layer 5-1, tunnel insulating layer 5-2, and tunnel insulating layer 5-3 are thin enough to allow tunnel current to flow in the direction of the film thickness.

Above bit line 2 and memory cell 10, inter-layer insulating film 7 is formed to coat bit line 2 and memory cell 10. Contact hole 8 is formed in inter-layer insulating film 7. Moreover, on the upper surface of inter-layer insulating film 7, word line 9 is formed. Word line 9 is connected to free magnetic layer 6-3 via contact hole 8. Electric current flows to word line 9 in the −x axis direction. When electric current flow to word line 9, a magnetic field is applied to free magnetic layer 6-1, free magnetic layer 6-2 and free magnetic layer 6-3 in the −y axis direction of.

As shown in FIG. 4, bit lines 2 and word lines 9 are provided in plural. Bit lines 2 are extended in x axis direction, and word lines 9 are extended in the y axis direction. At the parts where bit lines 2 and word lines 9 intersect, memory cell 10 is provided respectively between bit lines 2 and word lines 9.

The resistance of tunnel insulating layer 5-1, tunnel insulating layer 5-2, and tunnel insulating layer 5-3 to the direction of the film thickness varies depending on the direction of the magnetization of free magnetic layer 6-1, free magnetic layer 6-2, and free magnetic layer 6-3 due to the tunnel magnetic resistance result (TMR) shown by the ferromagnetic body.

FIGS. 5A and 5B show the resistance of tunnel insulating layer 5-1, tunnel insulating layer 5-2, and tunnel insulating layer 5-3 in the direction of the film thickness.

As shown in FIG. 5A, when the respective magnetization of fixed magnetic layer 4 and free magnetic layer 6-1 are in the same direction, the resistance between fixed magnetic layer 4 and free magnetic layer 6-1 caused by tunnel insulating layer 5-1 is $R_1$. On the other hand, as shown in FIG. 5B, when the respective magnetization of fixed magnetic layer 4 and free magnetic layer 6-1 are in opposite directions, the resistance between fixed magnetic layer 4 and free magnetic layer 6-1 caused by tunnel insulating layer 5-1 is $R_1+\Delta R_1$.

Also, as shown in FIG. 5A, the resistance between free magnetic layer 6-1 and free magnetic layer 6-2 caused by tunnel insulating layer 5-2 is $R_2$ when the respective magnetization directions of free magnetic layer 6-1 and free magnetic layer 6-2 are the same. On the other hand, as shown in FIG. 5B, the resistance between free magnetic layer 6-1 and free magnetic layer 6-2 caused by tunnel insulating layer 5-2 is $R_2+\Delta R_2$ when the respective magnetization directions of free magnetic layer 6-1 and free magnetic layer 6-2 are opposite.

In addition, as shown in FIG. 5A, the resistance of tunnel insulating layer 5-3 in the film thickness direction is $R_3$ when the magnetization of free magnetic layer 6-2 and free magnetic layer 6-3 are in the same direction. On the other hand, as shown in FIG. 5B, when the magnetization of free magnetic layer 6-1 and free magnetic layer 6-2 are in opposite directions, the resistance of tunnel insulating layer 5-2 in the direction of the film thickness is $R_3+\Delta R_3$.

At this point, the above $\Delta R_1$, $\Delta R_2$, and $\Delta R_3$ are determined so as to satisfy the following relational equations given that the predetermined resistance value is $\Delta R$:

$$\Delta R_1 = \Delta R/2^0 (=\Delta R),$$

$$\Delta R_2 = \Delta R/2^1$$

$$\Delta R_3 = \Delta R/2^2 \qquad (1)$$

By having $\Delta R_1$, $\Delta R_2$, and $\Delta R_3$ satisfy relational equations (1), memory cell 10 with three free magnetic layers can store 8 ($=2^3$) values as data.

Figure 6A:
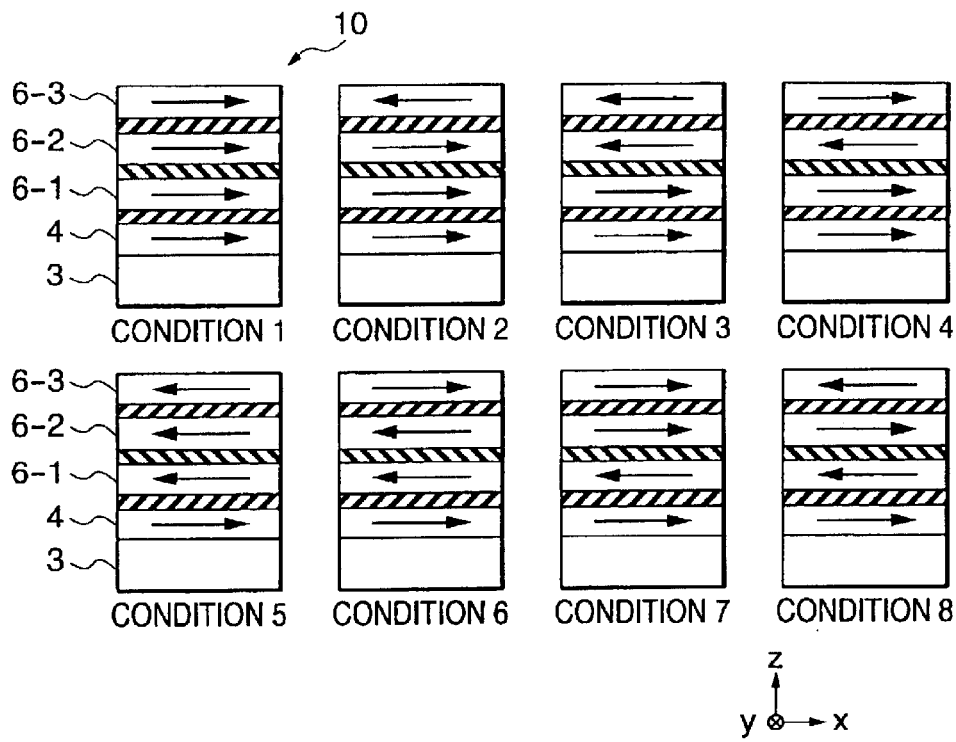
FIGS. 6A to 6B show the correspondence between resistance value $R_{read}$ between bit line and word line, and the condition of memory cell.
Figure 6B:
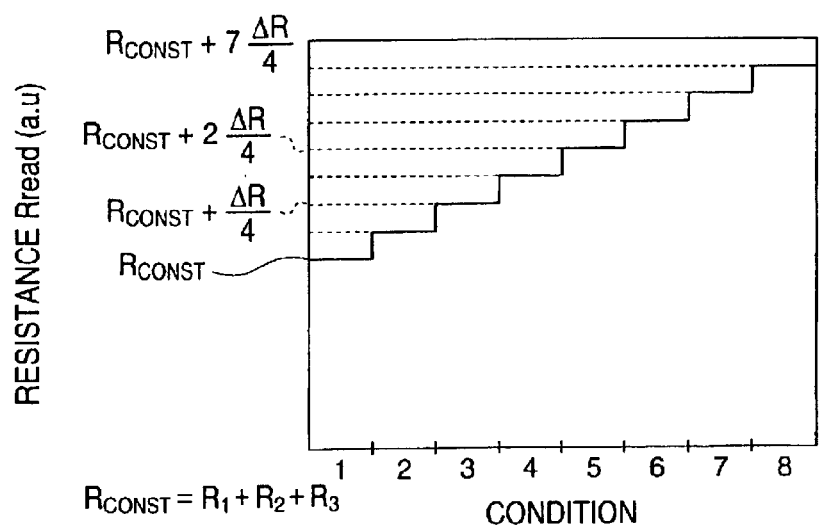

FIGS. 6a and 6B show the corresponding relationship of the resistance between bit line 2 and word line 9, and the respective directions of magnetization of free magnetic layer 6-1, free magnetic layer 6-2, and free magnetic layer 6-3. As shown in FIG. 6A, memory cell 10 can be under any of 8 conditions: condition 1 through condition 8. Condition 1 is a condition where the magnetization of all of free magnetic layer 6-1, free magnetic layer 6-2, and free magnetic layer 6-3 are in the +x axis direction. Condition 2 is a condition where the magnetizations of free magnetic layer 6-1 and free magnetic layer 6-2 are in the +x axis direction, and the magnetization of free magnetic layer 6-3 is in the −x axis direction. Condition 3 is a condition where the magnetization of free magnetic layer 6-1 is in the +x axis direction, and magnetizations of free magnetic layer 6-2 and free magnetic layer 6-3 is in the −x axis direction. Condition 4 is a condition where magnetizations of free magnetic layer 6-1 and free magnetic layer 6-3 is in the +x axis direction, and magnetization of free magnetic layer 6-2 is in the −x axis direction. Condition 5 is a condition where the magnetizations of all of free magnetic layer 6-1, free magnetic layer 6-2, and free magnetic layer 6-3 is in the −x axis direction. Condition 6 is a condition where the magnetization of free magnetic layer 6-3 is in the +x axis direction, and the magnetizations of free magnetic layer 6-1 and free magnetic layer 6-2 is in the −x axis direction. Condition 7 is a condition where the magnetizations of free magnetic layer 6-2 and free magnetic layer 6-3 is in the +x axis direction, and the magnetization of free magnetic layer 6-1 is in the −x axis direction. Condition 8 is a condition where the magnetization of free magnetic layer 6-2 is in the +x axis direction, and the magnetizations of free magnetic layer 6-1 and free magnetic layer 6-3 is in the −x axis direction.

As shown in FIG. 6B, when memory cell 10 is in condition i of condition 1 through condition 8 (i being an integer 1 or greater but no greater than 8), resistance $R_{read}$ between bit line 2 and word line 9 is:

$$R_{read} = R_{const} + (i-1) \times (\Delta R/2^2).$$

Here, $$R_{const} = \Delta R_1 + \Delta R_2 + \Delta R_3.$$

In this manner, resistance $R_{read}$ between bit line 2 and word line 9 becomes one of the respectively different 8 (=$2^3$) values depending on the magnetization direction of free magnetic layer 6-1, free magnetic layer 6-2, and free magnetic layer 6-3. Therefore, based on resistance $R_{read}$ between bit line 2 and word line 9, it is possible to determine which condition, of condition 1 through condition 8, memory cell 10 is under. In this manner, memory cell 10 can store 8 (=$2^3$) values as data, and also, the data stored can be read out from memory cell 10.

The above $\Delta R_1$, $\Delta R_2$, and $\Delta R_3$ are represented in the following equations:

$$\Delta R_1 = R_1 \times \gamma_1,$$

$$\Delta R_2 = R_2 \times \gamma_2,$$

$$\Delta R_3 = R_2 \times \gamma_3.$$

Here, $\gamma_1$, $\gamma_2$, and $\gamma_3$ denote the MR ratio. $R_1$ is, as described earlier, the resistance of tunnel insulating layer 5-1 in the film thickness direction when magnetization of fixed magnetic layer 4 and free magnetic layer 6-1 are in the same direction; $R_2$ is the resistance of tunnel insulating layer 5-2 in the film thickness direction when the magnetization of free magnetic layer 6-1 and free magnetic layer 6-2 are in the same direction; and $R_3$ is the resistance of tunnel insulating layer 5-3 in the film thickness direction when the magnetization of free magnetic layer 6-2 and free magnetic layer 6-3 are in the same direction. $\gamma_1$, $\gamma_2$, $\gamma_3$, $R_1$, $R_2$, and $R_3$ are set so that $\Delta R_1$, $\Delta R_2$, and $\Delta R_3$ satisfy equations (1).

$\gamma_1$, $\gamma_2$, and $\gamma_3$ can be adjusted in conformity with the type of magnetic material comprising fixed magnetic layer 4, free magnetic layer 6-1, free magnetic layer 6-2, and free magnetic layer 6-3. $\gamma_1$ is fixed in conformity with the types of magnetic material comprising fixed magnetic layer 4 and free magnetic layer 6-1. $\gamma_2$ is fixed in conformity with the types of magnetic material comprising free magnetic layer 6-1 and free magnetic layer 6-2. $\gamma_3$ is fixed in Conformity with the types of magnetic material comprising free magnetic layer 6-2 and free magnetic layer 6-3. The types of magnetic material comprising fixed magnetic layer 4, free magnetic layer 6-1, free magnetic layer 6-2, and free magnetic layer 6-3 is selected appropriately so that $\Delta R_1$, $\Delta R_2$, and $\Delta R_3$ satisfy equations (1).

Generally, the highr the magnetic polarizability x of the magnetic material, the highr the effect of tunnel magnetic resistance result and is the highr the MR ratio. As for a ferromagnetic body with a low magnetic polarizability x, $Ni_{0.8}Fe_{0.2}$ (magnetic polarizability: 37%) is known, and as for a ferromagnetic body that has a high magnetic polarizability x, Co (magnetic polarizability: 42%) and Fe (magnetic polarizability: 42 to 46%.) are known. Generally, the highr the magnetic polarizability x is, the greater the coercive force of the magnetic body. Adjustment of $\Delta R_1$, $\Delta R_2$, and $\Delta R_3$, by adjusting $\gamma_1$, $\gamma_2$, and $\gamma_3$, through the type of magnetic material, is advantageous in that resistance can be adjusted through the material itself, with no need for fine tuning such as through film thickness control, etc.

$R_1$, $R_2$, and $R_3$ are adjustable through:
(a) the film thickness of tunnel insulating layer 5-1, tunnel insulating layer 5-2, and tunnel insulating layer 5-3;
(b) the film quality and forming method of tunnel insulating layer 5-1, tunnel insulating layer 5-2, and tunnel insulating layer 5-3;
(c) the material comprising tunnel insulating layer 5-1, tunnel insulating layer 5-2, and tunnel insulating layer 5-3; and
(d) The area of tunnel insulating layer 5-1, tunnel insulating layer 5-2, and tunnel insulating layer 5-3.

The highr the respective film thickness of tunnel insulating layers 5-1, tunnel insulating layer 5-2, and tunnel insulating layer 5-3 are, the highr $R_1$, $R_2$, and $R_3$ respectively become. The respective film thickness of tunnel insulating layer 5-1, tunnel insulating layer 5-2, and tunnel insulating layer 5-3 are selected appropriately so that $\Delta R_1$, $\Delta R_2$, and $\Delta R_3$ satisfy equations (1). For instance, the film thickness of tunnel insulating layer 5-1 may be set to 18 Å; film thickness of tunnel insulating layer 5-2 to 14 Å; and film thickness of tunnel insulating layer 5-3 to 12 Å. This situation is advantageous in that $\Delta R_1$, $\Delta R_2$, and $\Delta R_3$ can be adjusted while using the same material for tunnel insulating layer 5-1, tunnel insulating layer 5-2, and tunnel insulating layer 5-3. It is preferable that the same material be used for tunnel insulating layer 5-1, tunnel insulating layer 5-2, and tunnel insulating layer 5-3 since the amount of equipment required to produce magnetic memory can be cutback or simplified.

Moreover, the film quality of tunnel insulating layer 5-1, tunnel insulating layer 5-2, and tunnel insulating layer 5-3 respectively affects $R_1$, $R_2$, and $R_3$. At this point, film quality of tunnel insulating layer 5-1, tunnel insulating layer 5-2, and tunnel insulating layer 5-3 can be changed depending on the method of forming tunnel insulating layer 5-1, tunnel insulating layer 5-2, and tunnel insulating layer 5-3 respectively. For instance, a case can be considered where alumina ($Al_2O_2$) film is used for tunnel insulating layer 5-1, tunnel insulating layer 5-2, and tunnel insulating layer 5-3. As for the method of forming the alumina film, a method, which first forms the aluminum thin film, and then oxidizes the aluminum thin film can be employed. Here, if the respective methods oxidizing the aluminum thin films differ, the resistance in the film thickness direction of the alumina film formed through oxidation also varies. As for the method of oxidizing the aluminum thin film, there are three methods known: the natural oxidation method, the plasma oxidation method, and the radical oxidation method. The natural oxidation method is a method of oxidizing aluminum thin film by leaving the aluminum thin film in an oxidation atmosphere at an ordinary temperature. The plasma oxidation method is a method of oxidizing aluminum thin film by exposing the aluminum thin film in an oxygen plasma. The radical oxidation method is a method of oxidizing the aluminum thin film by exposing the aluminum thin film in an oxidation atmosphere that includes oxygen radicals. An oxidation atmosphere which includes oxygen radicals can be produced by generating oxygen plasma and electrically naturalizing the oxygen ions included in the oxygen plasma. An alumina film formed by oxidizing the aluminum thin film with the natural oxidation method is different in quality from an alumina film formed by oxidizing an aluminum thin film with the radical oxidation method or plasma oxidation method, and resistance in the film thickness direction is low. The film quality of tunnel insulating layer 5-1, tunnel insulating layer 5-2, and tunnel insulating layer 5-3 and method of forming tunnel insulating layer 5-1, tunnel insulating layer 5-2, and tunnel insulating layer 5-3 are selected appropriately so that $\Delta R_1$, $\Delta R_2$, and $\Delta R_3$ satisfy equations (1).

Moreover, the material comprising tunnel insulating layer 5-1, tunnel insulating layer 5-2, and tunnel insulating layer 5-3 affects $R_1$, $R_2$, and $R_3$. For instance, $R_1$, $R_2$, and $R_3$ are adjustable depending on whether alumina or hafnium oxide is used as the material comprising tunnel insulating layer 5-1, tunnel insulating layer 5-2, and tunnel insulating layer 5-3.

Moreover, the area of tunnel insulating layer 5-1, tunnel insulating layer 5-2, and tunnel insulating layer 5-3 affects $R_1$, $R_2$, and $R_3$, respectively. As shown in FIG. 7B, the area of tunnel insulating layer 5-1 in contact with fixed magnetic layer 4 and free magnetic layer 6-1, area of tunnel insulating layer 5-2 in contact with free magnetic layer 6-1 and free magnetic layer 6-2, and the area of tunnel insulating layer 5-3 in contact with free magnetic layer 6-2 and free magnetic layer 6-3 can be adjusted by appropriately setting the masking pattern during the etching treatment on tunnel insulating layer 5-1, tunnel insulating layer 5-2, and tunnel insulating layer 5-3 Moreover, as shown in FIG. 7C, the area of tunnel insulating layer 5-1 in contact with fixed magnetic layer 4 and free magnetic layer 6-1, the area of tunnel insulating layer 5-2 in contact with free magnetic layer 6-1 and free magnetic layer 6-2, and the area of tunnel insulating layer 5-3 in contact with free magnetic layer 6-2 and free magnetic layer 6-3 can be adjusted by adjusting the side angle of tunnel insulating layers 5-1 through 5-3 and free magnetic layers 6-1 through 6-3 during the batch etching treatment on tunnel insulating layers 5-1 through 5-3 and on free magnetic layers 6-1 through 6-3. The area of tunnel insulating layer 5-1 in contact with fixed magnetic layer 4 and free magnetic layer 6-1, the area of tunnel insulating layer 5-2 in contact with free magnetic layer 6-1 and free magnetic layer 6-2, and area of tunnel insulating layer 5-3 in contact with free magnetic layer 6-2 and free magnetic layer 6-3 are selected appropriately so that $\Delta R_1$, $\Delta R_2$, and $\Delta R_3$ satisfy equations (1).

Adjusting $\Delta R_1$, $\Delta R_2$, and $\Delta R_3$ through the area of tunnel insulating layer 5-1, tunnel insulating layer 5-2, and tunnel insulating layer 5-3 is preferable in that it is possible to form tunnel insulating layer 5-1, tunnel insulating layer 5-2, and tunnel insulating layer 5-3 while keeping the film thickness and material of tunnel insulating layer 5-1, tunnel insulating layer 5-2, and tunnel insulating layer 5-3 the same.

As described above, $\Delta R_1$, $\Delta R_2$, and $\Delta R_3$ are adjusted so as to satisfy equations (1) through:

(A) the types and film thickness of magnetic material comprising fixed magnetic layer 4, free magnetic layer 6-1, free magnetic layer 6-2, and free magnetic layer 6-3;

(B) the film thickness of tunnel insulating layer 5-1, tunnel insulating layer 5-2, and tunnel insulating layer 5-3;

(C) the quality of film and forming method of tunnel insulating layer 5-1, tunnel insulating layer 5-2, and tunnel insulating layer 5-3;

(D) the material comprising tunnel insulating layer 5-1, tunnel insulating layer 5-2, and tunnel insulating layer 5-3; and (E) the area of tunnel insulating layer 5-1, tunnel insulating layer 5-2, and tunnel insulating layer 5-3.

This enables memory cell 10 to store 8 (=$2^3$) values as data, and also, it becomes possible for the stored data to be read from memory cell 10.

Memory cell 10 with such configuration has data written therein in the following manner.

Electric current 11 flows to word line 9, which is connected to memory cell 10 whereto data is to be written. In the following explanation, as shown in FIG. 4, it is given that electric current 11 flows to word line 9-2. As electric current 11 flows to word line 9-2 in the −x axis direction, as shown in FIG. 4, the memory cell connected to word line 9-2 of memory cell 10 is applied magnetic field 12 in the −y axis direction. As described earlier, the magnetization directions included in free magnetic layer 6-1, free magnetic layer 6-2, and free magnetic layer 6-3 are fixed in either the +x axis direction or the −x axis direction, and the magnetization does not reverse even if magnetic field 12 is applied to memory cell 10 in the −y axis direction. However, the magnetic field in the x axis direction required to reverse magnetization of free magnetic layer 6-1, free magnetic layer 6-2, and free magnetic layer 6-3 becomes low due to the asteroid characteristics exhibited by the magnetization.

Moreover, electric current 13 flows to bit line 2, which is connected to memory cell 10 whereto data is to be written. In the following explanation, as shown in FIG. 2, it is given that electric current 13 flows to bit line 2-2. As electric current 13 flows to bit line 2-2, a magnetic field is applied in either the in the +x axis direction or the −x axis direction to memory cell 10 connected to bit line 2-2.

As electric current 11 flows to word line 9-2, and electric current 13 flows to bit line 2-2, reversal of the polarization is performed selectively only in the memory cell 10 connected to word line 9-2 and bit line 2-2. At this point, the magnitude of electric current 13 flowing to bit line 2-2 is suppressed to a level which does not invoke polarization in the memory cells 10 not connected to word line 9-2. This processing causes data to be written only in the memory cell 10 where to the data is to be written.

The direction and magnitude of electric current 13 is controlled in time sequence as described below. FIGS. 8A through 8D, which show the style of controlling the direction and magnitude of electric current 13, are cross-sectional views of 2A—2A in FIG. 4. However, word lines 9-2, etc. are not illustrated. To begin with, as shown in FIG. 8B, electric current 13 is made to flow in a direction, where a magnetic field develops which directs free magnetic layer 6-1 in a the desired direction. As shown in FIG. 8B, when magnetization of free magnetic layer 6-1 is desired to be directed in the −x axis direction, electric current 13 is made to flow in the −y axis direction. At the same time, electric current 11 is made to flow to word line 9-2 in the direction shown in FIG. 4. At this time, the magnitude of electric current 13 and electric current 11 are set so that synthetic magnetic field $H_1$, which is high enough to reverse the magnetization of free magnetic layer 6-1, which has the highest coercive force among free magnetic layer 6-1, free magnetic layer 6-2, and free magnetic layer 6-3 is applied to free magnetic layer 6-1. At this time, the coercive force of free magnetic layer 6-2 and free magnetic layer 6-3 is lower than the coercive force of free magnetic layer 6-1, so, as shown in FIG. 8B, magnetization of free magnetic layer 6-1, free magnetic layer 6-2, and free magnetic layer 6-3 are all in the same direction. In the example shown in FIG. 8B, magnetization of free magnetic layer 6-1, free magnetic layer 6-2, and free magnetic layer 6-3 are all in the −x axis direction.

Continuing, as shown in FIG. 8C, electric current 13 is made to flow in a direction where a magnetic field develops which directs magnetization of free magnetic layer 6-2 is in a desired direction. As shown in FIG. 8C, when magnetization of free magnetic layer 6-2 should be in the +x axis direction, electric current 13 flows in the +y axis direction. At the same time, electric current 11 flows to word line 9-2 in the −x axis direction. At this time, the magnitude of electric current 13 and electric current 11 are set so that synthetic magnetic field $H_2$, which is high enough to reverse the magnetization of free magnetic layer 6-2 but not to reverse the magnetization of free magnetic layer 6-1, is produced. The magnetization of free magnetic layer 6-1 does not reverse, but maintains the present direction. At this time, the coercive force of free magnetic layer 6-3 is lower than the coercive force of free magnetic layer 6-2, so the magnetization of free magnetic layer 6-3 and the magnetization of free magnetic layer 6-2 are in the same direction.

Continuing, as shown in FIG. 8D, electric current 13 is made to flow so that the magnetization of free magnetic layer 6-3 is in the desired direction. As shown in FIG. 8D, when the magnetization of free magnetic layer 6-2 is to be directed in the −x axis direction, electric current 13 is flowed in the −y axis direction. At the same time, electric current 11 is flowed to word line 9-2 in the −x axis direction. Here, the magnitude of electric current 13 is set to produce magnetic field $H_3$, which is high enough to reverse the magnetization of free magnetic layer 6-3 but not to reverse the magnetization of free magnetic layer 6-1 and free magnetic layer 6-2. The magnetization of free magnetic layer 6-1 and free magnetic layer 6-2 does not reverse but maintains the present direction. The above operation directs the magnetization of free magnetic layer 6-1, free magnetic layer 6-2, and free magnetic layer 6-3 in the desired direction and completes writing of desired data.

In order to read out data that has been written, predetermined electric current is flowed to bit line 2 and word line 9 connected to memory cell 10 from which data is read out. At this time, as described earlier, resistance between bit line 2 and word line 9 is either one of 8 values: $R_{const}$, $R_{const}+$ R/4, ..., $R_{const}+7 \cdot \Delta R/4$ depending on the magnetization direction of free magnetic layer 6-1, free magnetic layer 6-2, and free magnetic layer 6-3. Data stored in memory cell 10 is distinguished based on the resistance between bit line 2 and word line 9.

As described above, magnetic memory according to this embodiment is capable of storing $2^3$ values in memory cell 10 as data depending on the direction of the magnetization of free magnetic layer 6-1, free magnetic layer 6-2, and free magnetic layer 6-3, and in addition $2^3$ values as data can be read out of memory cell 10.

In the embodiment, $\Delta R_1$, $\Delta R_2$, and $\Delta R_3$ are not always limited to $\Delta R/2^0$, $\Delta R/2^1$, and $\Delta R/2^2$.

In this embodiment, $\Delta R_1$, $\Delta R_2$, and $\Delta R_3$ can be any value if at least two of them are different. This enables memory cell 10 to store at least 4 or more values as data.

However, it is preferable that $\Delta R_1$, $\Delta R_2$, and $\Delta R_3$ be different from each other. This enables memory cell 10 to store at least 7 values or more as data.

Moreover, when $\Delta R_1$, $\Delta R_2$, and $\Delta R_3$ are different from each other, it is preferable that $\Delta R_1$, $\Delta R_2$, and $\Delta R_3$ be set so that each sum of any progression generated from set $\{\Delta R_1, \Delta R_2, \text{ and } \Delta R_3\}$ be different. In other words, it is preferable that $\Delta R_1$, $\Delta R_2$, and $\Delta R_3$ be set so that $\Delta R_1$, $\Delta R_2$, $\Delta R_3$, $\Delta R_1+\Delta R_2$, $\Delta R_2+\Delta R_3$, $\Delta R_3+\Delta R_1$, and $\Delta R_1+\Delta R_2+\Delta R_3$ become different values from each other. This makes resistance value, $R_{read}$, between bit line 2 and word line 9 to be one of 8 different values:

$R_{const}(=R_1+R_2+R_3)$, $R_{const}+\Delta R_1$, $R_{const}+\Delta R_2$, $R_{const}+\Delta R_3$, $R_{const}+\Delta R_1+\Delta R_2$, $R_{const}+\Delta R_2+\Delta R_3$, $R_{const}+\Delta R_3+\Delta R_1$, and $R_{const}+\Delta R_1+\Delta R_2+\Delta R_3$, and makes it possible to store 8 values as data.

However, as described above, it is preferable that $\Delta R_1$, $\Delta R_2$, and $\Delta R_3$ be any of $\Delta R/2^0$, $\Delta R/2^1$, and $\Delta R/2^2$ values. This causes resistance value $R_{read}$ between bit line 2 and word line 9 to change linearly depending on the magnetization direction of tunnel insulating layers 5-1 through 5-3, and makes it easier to distinguish data stored in memory cell 10 from resistance value, $R_{read}$.

At this time, provided that each of $\Delta R_1$, $\Delta R_2$, and $\Delta R_3$ are values different from each other, they can be any of the value either $\Delta R/2^0$, $\Delta R/2^1$, or $\Delta R/2^2$. As described above, $\Delta R_1$, $\Delta R_2$, and $\Delta R_3$ are not always set to satisfy equations (1) For instance, $\Delta R_1$, $\Delta R_2$, and $\Delta R_3$ can be set as $R_1=\Delta R/2^2$, $R_2=\Delta R/2^1$, $R_3=\Delta R/2^0$.

Figure 9:
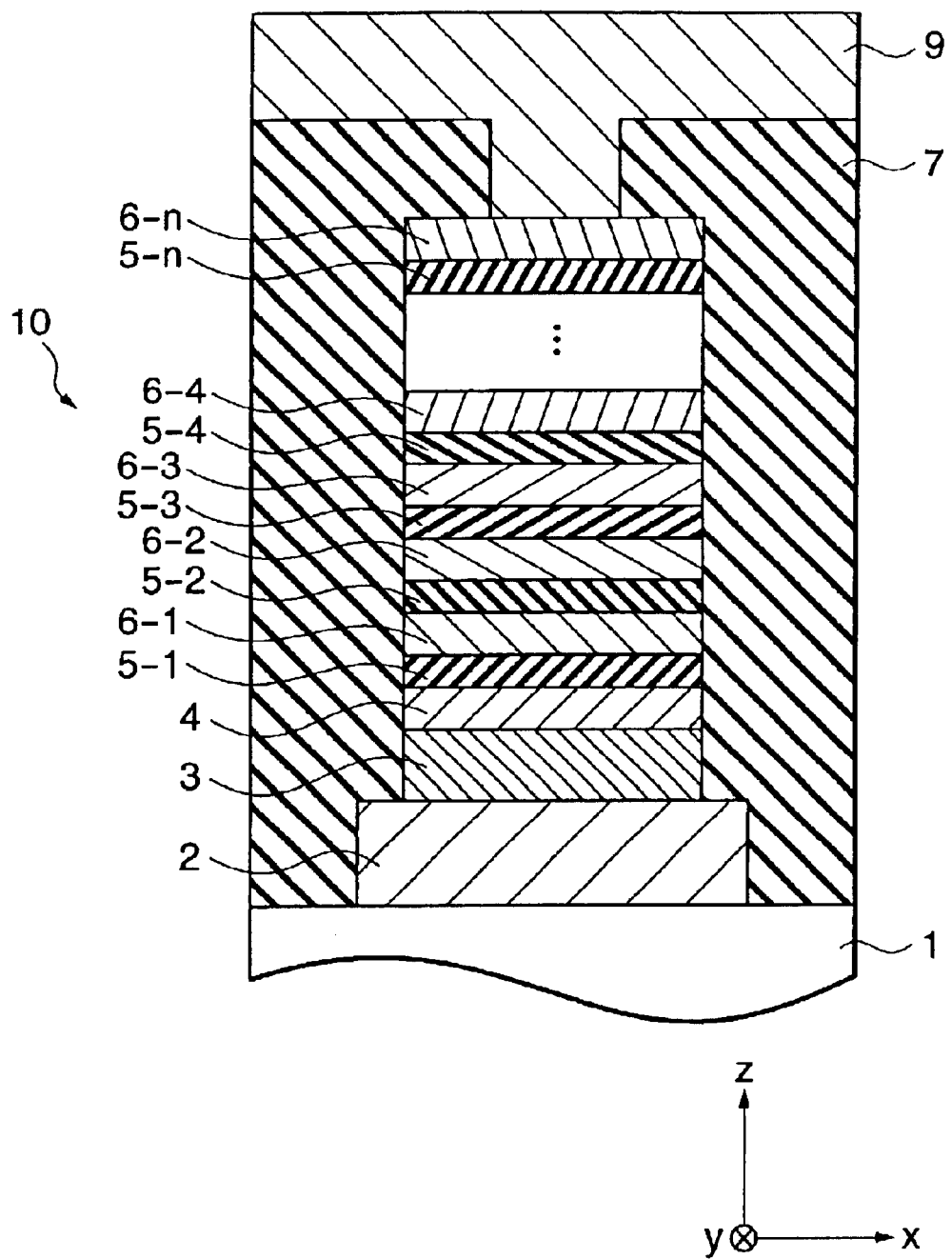
FIG. 9 shows a magnetic memory cell according to a third embodiment.

In addition, in this embodiment, the number of tunnel insulating layers and free magnetic layers are not limited to 3. The number of tunnel insulating layers and free magnetic layers can be any numbers as long as they are plural. For instance, as shown in FIG. 9, tunnel insulating layer 5-4, free magnetic layer 6-4, and so on through to, tunnel insulating layer 5-n, and free magnetic layer 6-n can be formed in that order on the upper surface of free magnetic layer 6-3. In other words, as for the number of set of tunnel insulating layers and free magnetic layers, n sets can be built up in that order provided that n is a natural number of 2 or greater.

In this case, the resistance of tunnel insulating layers 5-1 through 5-n in the film thickness direction can be set in the following manner. In the explanation below, the resistance of tunnel insulating layer 5-1 in the film thickness direction is $R_1$ when the magnetization of fixed magnetic layer 4 beneath tunnel insulating layer 5-1 and free magnetic layer 6-1 on the upper surface of tunnel insulating layer 5-1 are in the same direction, and the resistance is $R_1+\Delta R_1$ when in opposite directions. In addition, the resistance of tunnel insulating layer 5-i in the film thickness direction is $R_i$ when magnetization of free magnetic layer 6-(i−1) beneath tunnel insulating layer 5-i (i being an integer of 2 or greater but no greater than n) amongst tunnel insulating layer 5-2 through tunnel insulating layer 5-n and free magnetic layer 6-i thereupon are in the same direction; and when opposite, the resistance of tunnel insulating layer 5-i is $R_i+\Delta R_i$.

At this point, $\Delta R_1$ through $\Delta R_n$, can be any value if at least two of them are different. This enables memory cell 10 to store at least n+1 or more values as data.

However, similar to the case of n=3 described above, it is preferable that $\Delta R_1$ through $\Delta R_n$ be set so that each of them are different from each other. This enables memory cell 10 to store at least $\{(n^2+n+2)/2\}$ or more values as data.

At this time, similar to the case of n=3 described above, it is preferable that $\Delta R_1$ through $\Delta R_n$ be set so that the sum of any progression generated from set $\{\Delta R_1, \Delta R_2, \ldots, \Delta R_n\}$ is different from each other. This enables memory cell 10 to store $2^n$ values as data. In the magnetic memory according to this embodiment, the number of values that can be stored in memory cell 10 increases in the order of 2 to the n-th power ($2^n$) for the number of free magnetic layers, n.

Moreover, as with the case of n=3 described above, it is preferable that $\Delta R_1$ through $\Delta R_n$ be set to any one of $\Delta R$, $\Delta R/2^1, \Delta R/2^2, \ldots, \Delta R/2^{n-1}$.

Figure 10:
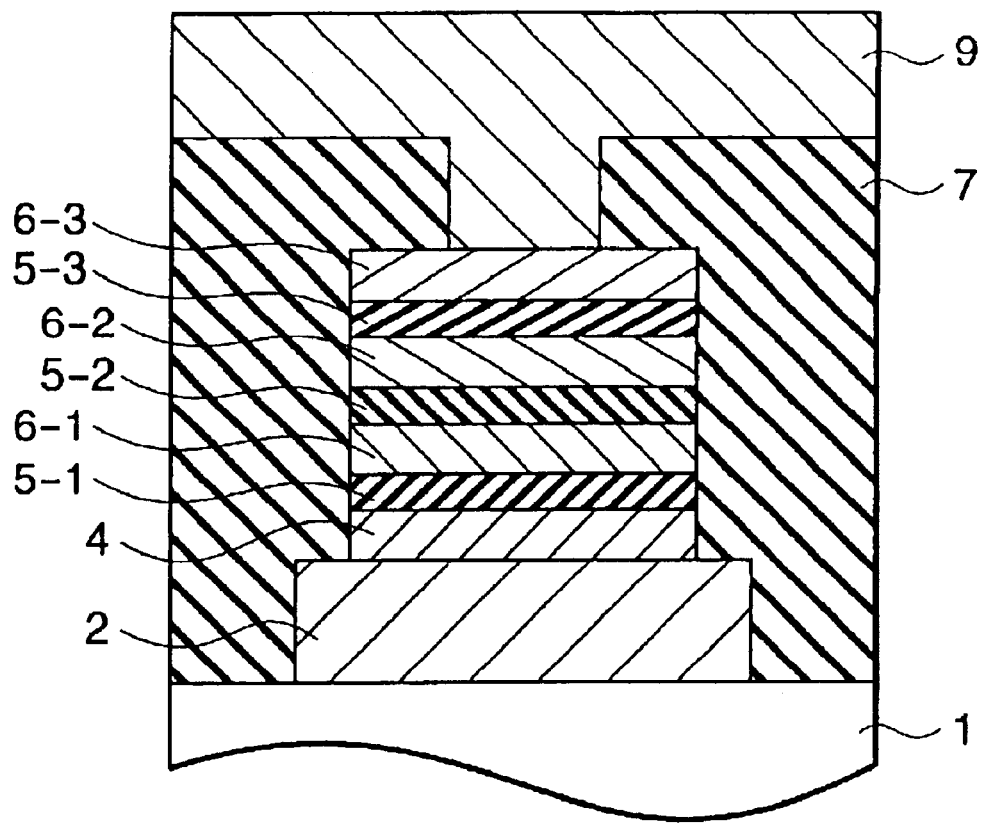
FIG. 10 shows a magnetic memory cell according to a fourth embodiment.

As shown in FIG. 10, it is possible that antiferromagnetic layer 3 cannot be provided as a third embodiment of the present invention. In this case, fixed magnetic layer 4 is provided directly upon the surface of bit line 2. Since the structure of memory cell 10 can be simplified, it is preferable that antiferromagnetic layer 3 be not provided. However, in this case, the coercive force of fixed magnetic layer 4 and the magnitude of electric current 13 and electric current 11, which are respectively made to flow to bit line 2 and word line 9, must be controlled so as not to reverse the magnetization of fixed magnetic layer 4 when tunnel insulating layer 5-1 is reversed.

Figure 11:
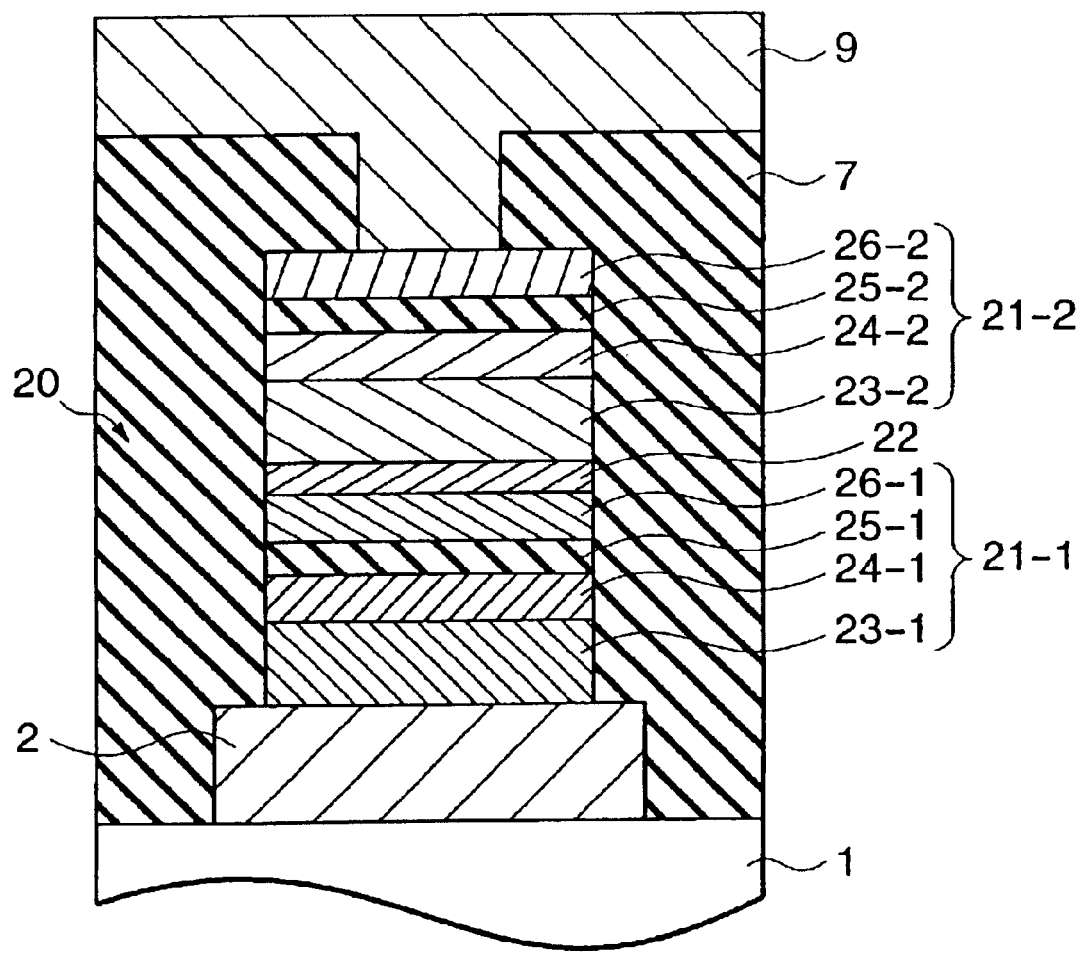
FIG. 11 is a cross-sectional view showing a magnetic memory structure according to a fifth embodiment.

FIG. 11 shows memory cell 20 of a magnetic memory according to a fourth embodiment of the present invention. This magnetic memory comprises a structure wherein memory cell 10 in the magnetic memory according to the first embodiment is replaced by memory cell 20.

Memory cell 20 comprises TMR element 21-1, TMR element 21-2, and buffer conduction layer 22. TMR element 21-1 and TMR element 21-2 are electrically connected with buffer conduction layer 22. TMR element 21-1 is electrically connected in series with TMR element 21-2 between bit line 2 and word line 9.

TMR element 21-1 comprises antiferromagnetic layer 23-1, fixed magnetic layer 24-1, tunnel insulating layer 25-1, and free magnetic layer 26-1. Antiferromagnetic layer 23-1 is formed on the upper surface of bit line 2. Fixed magnetic layer 24-1 is formed on the upper surface of antiferromagnetic layer 23-1. Fixed magnetic layer 24-1 is formed with ferromagnetic material. The magnetization direction of fixed magnetic layer 24-1 is fixed through interaction with antiferromagnetic layer 23-1. Tunnel insulating layer 25-1 is formed on the upper surface of fixed magnetic layer 24-1. Tunnel insulating layer 25-1 is formed with an insulator such as alumina, or hafnium oxide. The thickness of tunnel insulating layer 25-1 is thin to the degree that the tunnel current can flow in the film thickness direction. Free magnetic layer 26-1 is formed on the upper surface of tunnel insulating layer 25-1. Free magnetic layer 26-1 is formed with ferromagnetic body. The magnetization of free magnetic layer 26-1 is reversible, and the magnetization direction of free magnetic layer 26-1 is either in the +x axis direction or in the −x axis direction depending on the direction of magnetic field applied.

Buffer conduction layer 22 is formed on the upper surface of free magnetic layer 26-1

TMR element 21-2 comprises antiferromagnetic layer 23-2, fixed magnetic layer 24-2, tunnel insulating layer 25-2, and free magnetic layer 26-2. Antiferromagnetic layer 23-2 is formed the upper surface of buffer conduction layer 22. Fixed magnetic layer 24-2 is formed on the surface of antiferromagnetic layer 23-2. Fixed magnetic layer 24-2 is formed with ferromagnetic material. The magnetization of fixed magnetic layer 24-2 is fixed through interaction with antiferromagnetic layer 23-2. Tunnel insulating layer 25-2 is formed on the upper surface of fixed magnetic layer 24-2. Tunnel insulating layer 25-2 is formed with insulator such as alumina, or hafnium oxide. Thickness of tunnel insulating layer 25-2 is thin to the level that tunnel current can be applied in the film thickness direction. Free magnetic layer 26-2 is formed with ferromagnetic material. The magnetization of free magnetic layer 26-2 is reversible, and the magnetization direction of free magnetic layer 26-2 is either in the +x axis direction or in the −x axis direction depending on the direction of magnetic field applied. At this time, coercive force of free magnetic layer 26-2 is lower than coercive force of free magnetic layer 26-1.

The resistance of tunnel insulating layer 25-1 and tunnel insulating layer 25-2 in the film thickness direction varies depending on the direction of the magnetization of free magnetic layer 26-1 and free magnetic layer 26-1 by the tunnel magnetism resistance effect (TMR) exhibited by ferromagnetic body. FIGS. 12A and 12B show resistance of tunnel insulating layer 25-1 and tunnel insulating layer 25-2 in the film thickness direction.

As shown in FIG. 12A, when the magnetization of fixed magnetic layer 24-1 and free magnetic layer 26-1 are in the same direction, resistance between fixed magnetic layer 24-1 and free magnetic layer 26-1 due to tunnel insulating layer 25-1 is $R_1\square$. On the other hand, as shown in FIG. 12B, when the magnetization of fixed magnetic layer 24-1 and free magnetic layer 26-1 are in the opposite direction, resistance between fixed magnetic layer 24-1 and free magnetic layer 26-1 due to tunnel insulating layer 25-1 is $R_1\square+\Delta R_1$.

Similarly, as shown in FIG. 12A, the resistance between free magnetic layer 26-1 and free magnetic layer 26-2 due to tunnel insulating layer 25-2 is $R_2\square$ when the magnetization of free magnetic layer 26-1 and free magnetic layer 26-2 are in the same direction. On the other hand, as shown in FIG. 12B, when the magnetization of free magnetic layer 26-1 and free magnetic layer 26-2 are in the opposite direction, the resistance between free magnetic layer 26-1 and free magnetic layer 26-2 due to tunnel insulating layer 25-2 is $R_2\square+\Delta R_2\square$.

At this point, the above $\Delta R_1\square$ and $\Delta R_2\square$ are set so as to satisfy the following relational equations:

$$R_1\square = \Delta R\square/2^0 (=\Delta R\square)$$

$$R_2\square = \Delta R\square/2^1 (=\Delta R\square/2) \qquad (2)$$

R☐ is a predetermined resistance value. By $\Delta R_1$☐ and $\Delta R_2$☐ satisfying the equations (2), the resistance value between bit line 2 and word line 9 is any one of four values: $R_{const}$☐ (=$R_1$+$R_2$), $R_{const}$+$\Delta R$☐/2, $R_{const}$+$\Delta R$☐, or $R_{const}$+3$\Delta R$☐/2. The magnetization direction of free magnetic layer 26-1 and free magnetic layer 26-2 can be distinguished with the resistance value between bit line 2 and word line 9. Memory cell 20 can store 4 (=$2^2$) values as data.

Here, similar to the case of the first embodiment, $\Delta R_1$☐ and $\Delta R_2$☐ are adjusted so as to satisfy equations (2) through:

(A) the types and film thickness of the magnetic material comprising fixed magnetic layer 24-1, free magnetic layer 26-1, fixed magnetic layer 24-2, and free magnetic layer 26-2;

(B) the film thickness of tunnel insulating layer 25-1 and tunnel insulating layer 25-2;

(C) the quality of film and forming method of tunnel insulating layer 25-1 and tunnel insulating layer 25-2;

(D) the material comprising tunnel insulating layer 25-1 and tunnel insulating layer 25-2; and (E) the area of tunnel insulating layer 25-1 and tunnel insulating layer 25-2.

The operation to write data in memory cell 20 is the same as that in the first embodiment.

As with the first embodiment, electric current is made to flow to word line 9, which is connected to memory cell 20 where to data is written in the −x axis direction. Magnetic field is flowed in the −y axis direction to memory cell 20, which is connected to word line 9 whereto electric current is flowed. Due to the asteroid characteristics exhibited by the magnetization, the magnitude of the magnetic field in the x axis direction required to the reverse the magnetization of free magnetic layer 26-1 and free magnetic layer 26-2 of memory cell 20, which is connected to word line 9 whereto electric current is flowed, becomes low.

Moreover, as shown in FIGS. 13A to 13C, electric current 13 flows to bit line 2 either in the +y axis direction or in the −y axis direction. The direction and magnitude of electric current 13 is controlled in time sequence as described in the following. To begin with, as shown in FIG. 13B, electric current 13 is flowed in a direction so as to direct the magnetization of free magnetic layer 26-1 in the desired direction. As shown in FIG. 13B, when the magnetization of free magnetic layer 26-2 is to be directed towards the −x axis direction, electric current 13 is made to flow in the −y axis direction. At the same time, electric current 11 flows to word line 9. At this point, the magnitude of electric current 13 and electric current 11 is controlled so that synthetic magnetic field $H_1$, which has a magnitude high enough to reverse the magnetization of free magnetic layer 26-1, which has the highr coercive force out of free magnetic layer 26-1 and free magnetic layer 26-2. At this point, the magnetization of free magnetic layer 26-1 and free magnetic layer 26-2 are in the same direction because the coercive force of free magnetic layer 26-2 is lower than the coercive force of free magnetic layer 26-1. The direction of the magnetization of fixed magnetic layer 24-1 and fixed magnetic layer 24-2 does not reverse but maintains the present direction due to interaction with antiferromagnetic layer 23-1 and antiferromagnetic layer 23-2, respectively. In the example shown in FIG. 13B, the magnetization of both free magnetic layer 26-1 and free magnetic layer 26-2 is in the −x axis direction.

Then, as shown in FIG. 13C, electric current 13 is flowed so as to direct the magnetization of free magnetic layer 26-2 in the desired direction. As shown in FIG. 13C, electric current 13 is flowed in the +y axis direction when the magnetization of free magnetic layer 26-2 is to be directed in the +x axis direction. Moreover, electric current 11 flows to word line 2. At this point, the magnitude of electric current 13 and electric current 11 are set so as to generate synthetic magnetic field $H_2$, which has a magnitude high enough to reverse the magnetization of free magnetic layer 26-2 but not to reverse the magnetization of free magnetic layer 26-1. The magnetization of free magnetic layer 26-1 does not reverse, but remains in the present direction. The magnetization direction of fixed magnetic layer 24-1 and fixed magnetic layer 24-2 do not reverse but maintain the present direction due to interaction with antiferromagnetic layer 23-1 and antiferromagnetic layer 23-2, respectively. With the above operation, the respective magnetizations of free magnetic layer 26-1 and free magnetic layer 26-2 are directed to the desired direction and writing of desired data is completed.

In order to read out data that has been written, a predetermined electric current is made to flow to bit line 2 and word line 9, which are connected to memory cell 20 wherefrom data is to be read out. At this point, as described earlier, the resistance between bit line 2 and word line 9 is any one of four resistance values: $R_{const}$☐, $R_{const}$☐+$\Delta R$☐/2, $R_{const}$☐+$\Delta R$☐, or $R_{const}$☐+3·$\Delta R$☐/2, each of which are dependent on the magnetization direction of free magnetic layer 26-1 and free magnetic layer 26-2. Data stored in memory cell 20 is distinguished based on the resistance between bit line 2 and word line 9.

As described above, magnetic memory of this embodiment is capable of storing $2^2$ values as data in memory cell 20 depending on the magnetization direction of free magnetic layer 26-1 and free magnetic layer 26-2, and further, is capable of reading $2^2$ values as data from memory cell 20.

Moreover, the respective directions of the magnetization of fixed magnetic layer 24-1 and fixed magnetic layer 24-2 are fixed so as to stabilize the operation of the magnetic memory.

In this embodiment, $\Delta R_1$☐ and $\Delta R_2$☐ can take any arbitrary value as long as they are different from each other. As described above, $\Delta R_1$ and $\Delta R_2$ are not exclusively limited to any of the values: $\Delta R/2^0$, $\Delta R/2^1$, and $\Delta R/2^2$. If $\Delta R_1$☐ and $\Delta R_2$☐ are different from each other, resistance value $R_{read}$ between bit line 2 and word line 9 may be any one of four resistance values: $R_{const}$☐, $R_{const}$☐+$\Delta R_1$☐, $R_{const}$+$\Delta R_2$☐, or $R_{const}$☐+$\Delta R_1$☐+$\Delta R_2$☐. In this manner, memory cell 20 can store four values as data by having $\Delta R_1$☐ and $\Delta R_2$☐ different from each other.

However, as described above, it is preferable that $\Delta R_1$☐ and $\Delta R_2$☐ be either $\Delta R$☐/$2^0$ or $\Delta R$☐/$2^1$. This changes $R_{read}$ linearly depending on the magnetization direction of free magnetic layers 26-1 through 26-3, and it becomes easier to distinguish data stored in memory cell 20 from $R_{read}$.

At this time, it is arbitrary which respective value $\Delta R_1$ and $\Delta R_2$ will take from either $\Delta R/2^0$ or $\Delta R/2^1$. In other words, it is also possible to set:

$$R_1 = \Delta R/2^1,$$

$$R_2 = \Delta R/2^0. \quad (2)☐.$$

Figure 14:
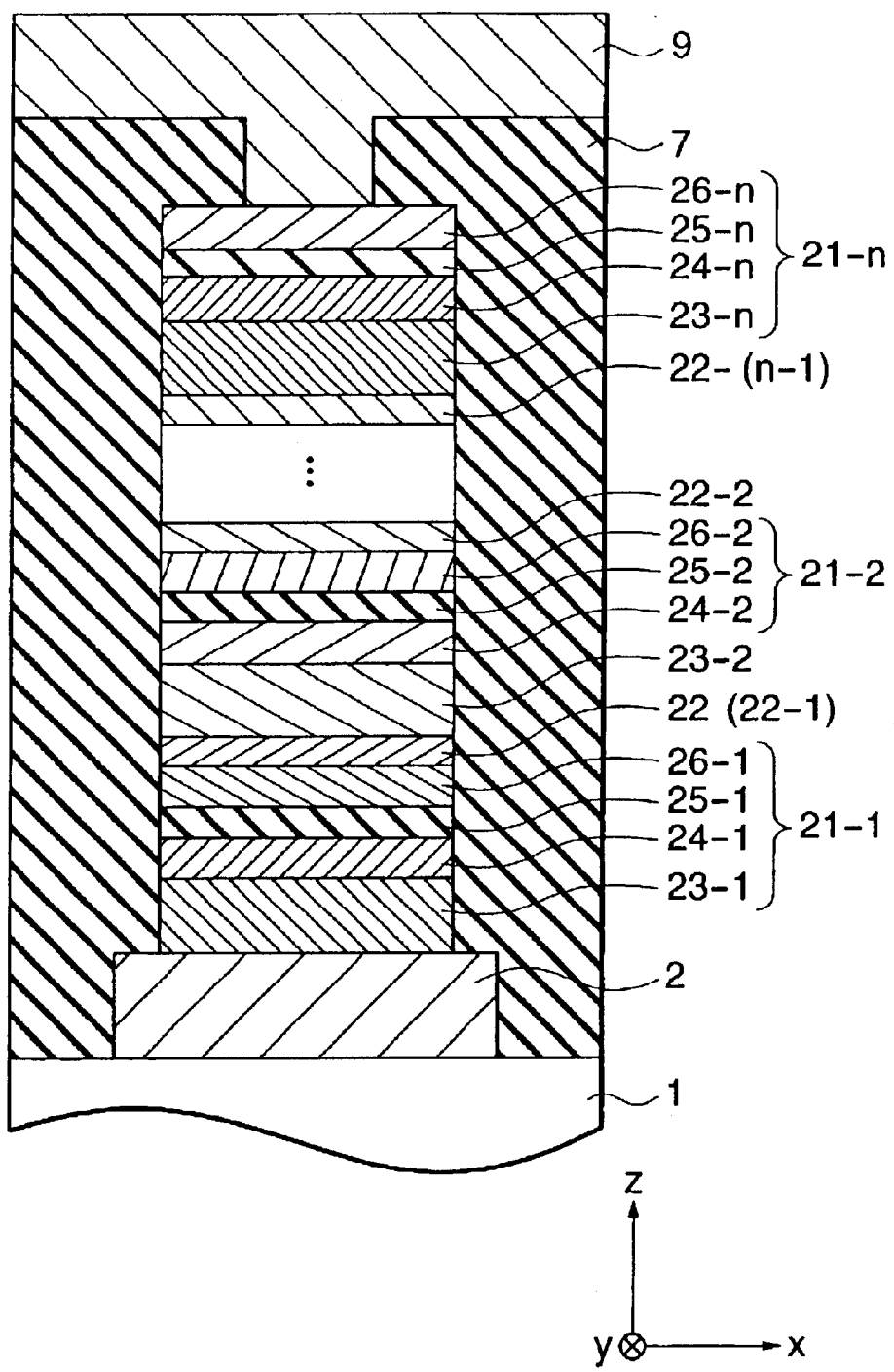
FIG. 14 shows a magnetic memory cell according to a sixth embodiment.

Moreover, as a fifth embodiment, as shown in FIG. 14, it is possible to connect n-number of TMR elements 21-1 through 21-n in series between bit line 2 and word line 9. In other words, the number of TMR elements is not limited to two. Here, TMR element 21-i (i being an integer of 1 or greater but no greater than n) out of elements 21-1 through 21-n comprises, deposited in order, antiferromagnetic layer 23-i, fixed magnetic layer 24-i, tunnel insulating layer 25-i, and free magnetic layer 26-i. TMR element 21-i□ (i□ being an integer of 1 or greater but no greater than n) and TMR element 21-(i□+1) are connected to each other by buffer conduction layer 22-i□.

In this case, the resistance of tunnel insulating layers 25-1 through tunnel insulating layer 25-n in the film thickness direction are set as follows. In the following explanation, when the magnetization of fixed magnetic layer 24-i beneath tunnel insulating layer 25-i and free magnetic layer 26-i on tunnel insulating layer 25-i are in the same direction, it is given that the resistance of tunnel insulating layer 25-i in the film thickness direction is Ri□, and when in opposite direction, Ri□+ΔR₁□.

At this point, ΔR₁□ through ΔRₙ□ are set so that at least two of them are different. This enables memory cell 20 to store at least $\{(n^2+n+2)/2\}$ values as data.

Moreover, it is preferable that the sum of any progression generated from set $\{\Delta R_1\square, \Delta R_2\square, \ldots, \Delta R_{n\square}\}$ be different from each other. This makes it possible for memory cell 20 to store $2^n$ values as data. The number of values that can be stored in a single memory cell 20 increases by the order of 2 to the n-th power ($2^n$) in the magnetic memory as claimed in this embodiment.

However, similar to the first embodiment, it is preferable that ΔR₁□ through ΔRn□ be set as any of ΔR□, ΔR□/2¹, ΔR□/2², ..., ΔR□/2ⁿ⁻¹, respectively.

Figure 15:
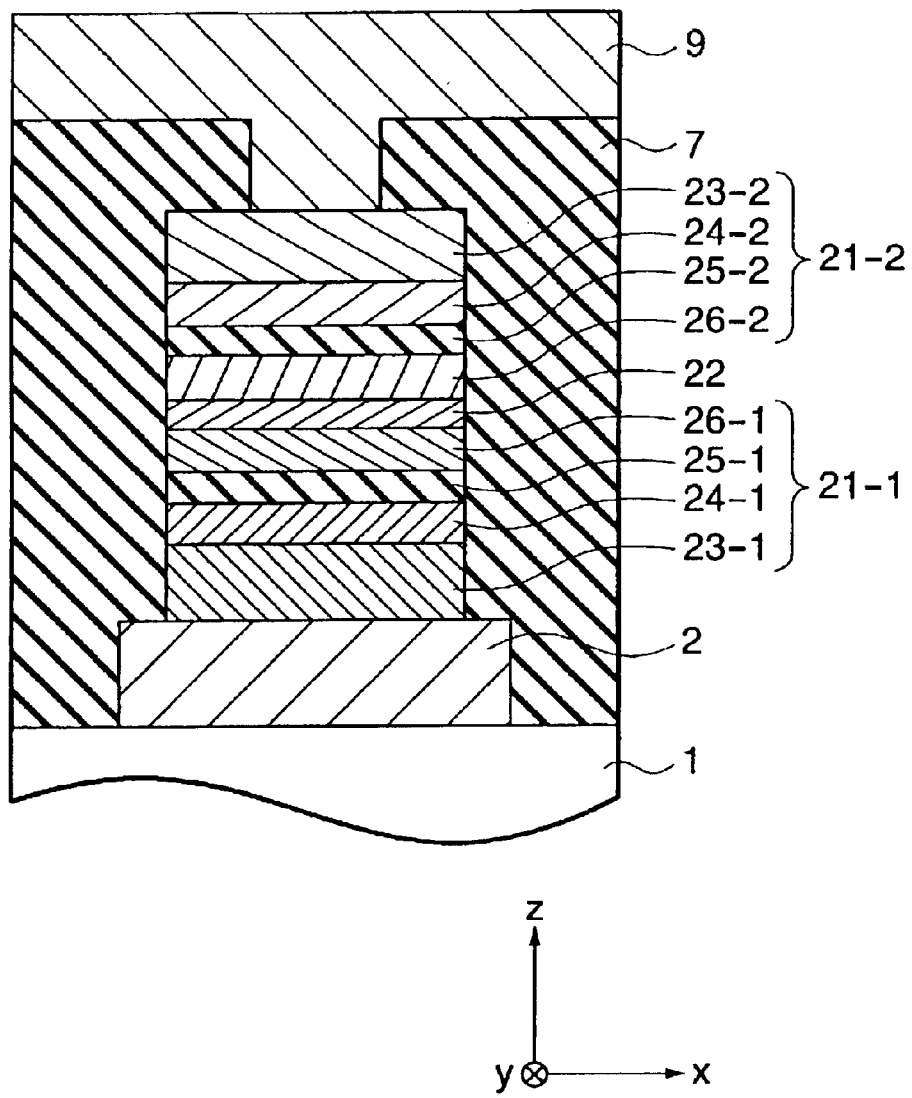
FIG. 15 shows a magnetic memory cell according to a seventh embodiment.
Figure 16:
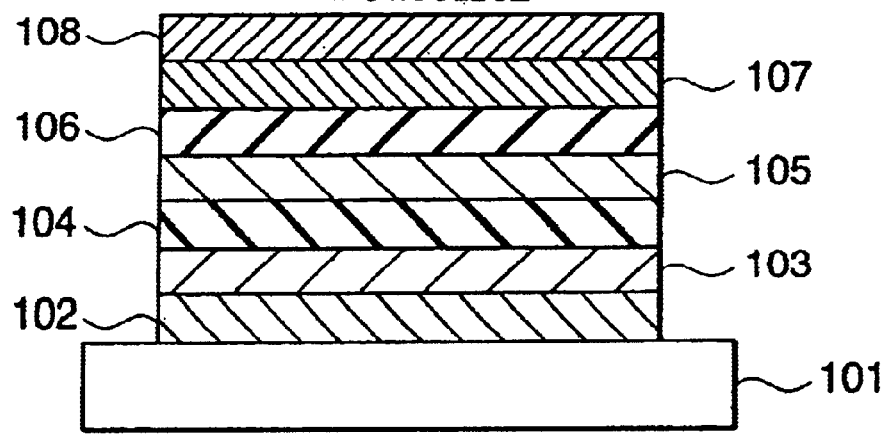
FIG. 16 shows a magnetic memory cell of a related art.
Figure 17:
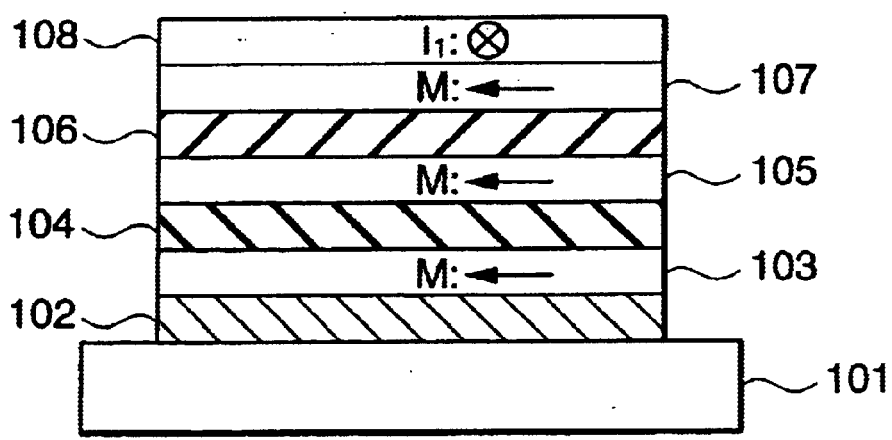
FIG. 17 shows the operation of the magnetic memory cell in FIG. 16.
Figure 18:
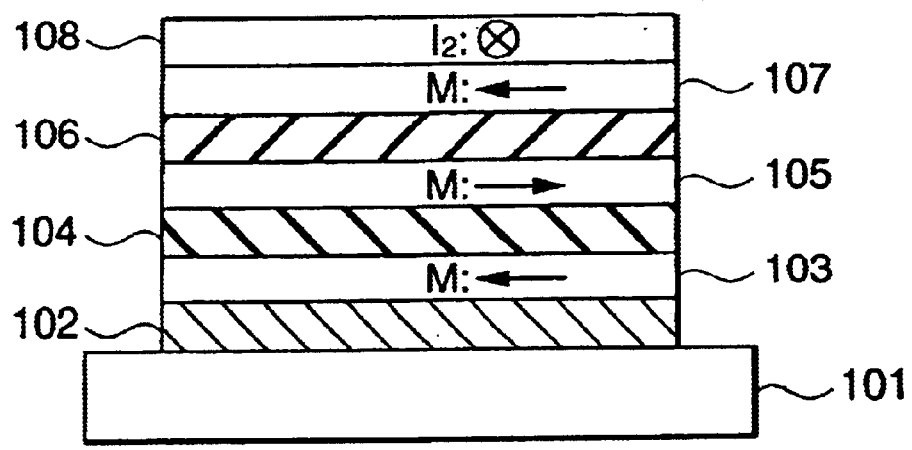
FIG. 18 shows the operation of the magnetic memory cell in FIG. 16.
Figure 19:
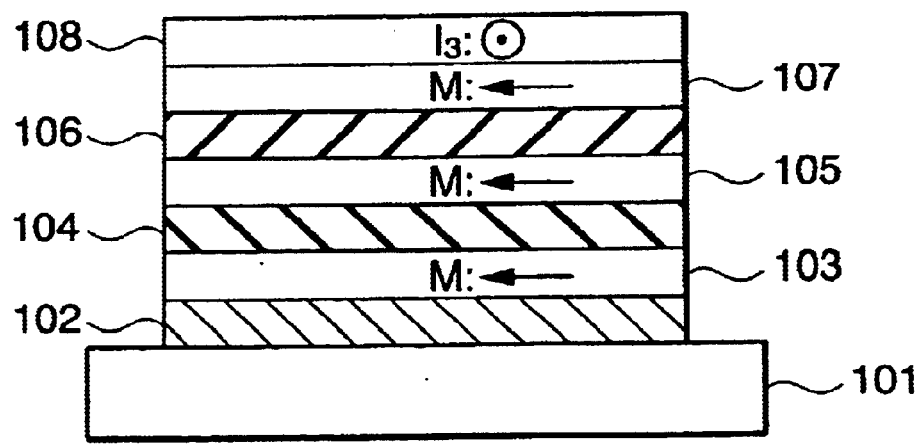
FIG. 19 shows the operation of the magnetic memory cell in FIG. 16.

Moreover, in the fourth and fifth embodiments, it is arbitrary whether the fixed magnetic layer or free magnetic layer comprising a single TMR element is positioned on the substrate side. For instance, as shown in FIG. 15, free magnetic layer 26-2 can be located on the substrate side and connected to buffer conduction layer 22, and antiferromagnetic layer 23-2 and fixed magnetic layer 24-2 be on the opposite side as the substrate and connected to word line 9, as a sixth embodiment.

As a seventh embodiment, its magnetic memory has the structure similar to the magnetic memory according to first embodiment shown in FIG. 1 or FIG. 3. However, the resistance of tunnel insulating layer 5-1, tunnel insulating layer 5-2, and tunnel insulating layer 5-3 in the film thickness direction is set to be different from the first embodiment.

In the seventh embodiment, unlike the first embodiment, the above described $\Delta R_1$, $\Delta R_2$, and $\Delta R_3$ are set to satisfy the following relational equations wherein it is given that the predetermined resistance value is ΔR:

$$\Delta R_1 = \Delta R,$$

$$\Delta R_2 = 2\Delta R/3,$$

$$\Delta R_3 = \Delta R/3, \quad (3)$$

Here, the resistance between fixed magnetic layer 4 and free magnetic layer 6-1 due to tunnel insulating layer 5-1 is $R_1$ when the magnetization of fixed magnetic layer 4 and free magnetic layer 6-1 is in the same direction, and the resistance is $R_1+\Delta R_1$ when the magnetization of fixed magnetic layer 4 and free magnetic layer 6-1 is in the opposite direction. Moreover, the resistance between free magnetic layer 6-1 and free magnetic layer 6-2 due to tunnel insulating layer 5-2 is $R_2$ when the magnetization of free magnetic layer 6-1 and free magnetic layer 6-2 is in the same direction, and the resistance is $R_2+\Delta R_2$ when the magnetization of free magnetic layer 6-1 and free magnetic layer 6-2 is in the opposite direction. The resistance between free magnetic layer 6-2 and free magnetic layer 6-3 by tunnel insulating layer 5-3 is $R_3$ when the magnetization of free magnetic layer 6-2 and free magnetic layer 6-3 is in the same direction. Further, resistance between free magnetic layer 6-1 and free magnetic layer 6-2 due to tunnel insulating layer 5-3 is $R_3+\Delta R_3$ when the magnetization of free magnetic layer 6-2 and free magnetic layer 6-3 is in the opposite direction.

By setting $\Delta R_1$, $\Delta R_2$, and $\Delta R_3$ so as to satisfy the equations (3), the resistance, $R_{read}$, between bit line 2 and word line 9 becomes any one of seven values: $R_{const}$, $R_{const}+\Delta R/3$, $R_{const}+2\Delta R/3$, ..., $R_{const}+5\Delta R/3$, and $R_{const}+6\Delta R/3$. This makes it possible for $R_{read}$ to change linearly depending on the magnetization direction of free magnetic layers 6-1 through 6-3 and easier to distinguish data stored in memory cell 10 from $R_{read}$.

As shown in FIG. 9, when n sets of tunnel insulating layer and free magnetic layer are built up in that order, $\Delta R_1$, $\Delta R_2$, ..., and $\Delta R_n$ are set so that each of $\Delta R_1$, $\Delta R_2$, ..., and $\Delta R_n$ are different and $\Delta R_1$, $\Delta R_2$, ..., and $\Delta R_n$ are any of n-number of values: $\Delta R/n$, $2\Delta R/n$, $3\Delta R/n$, ..., $(n-1)\Delta R/n$, and $\Delta R$ respectively. Here, it is given that the resistance of tunnel insulating layer 5-1 in the film thickness direction is $R_1$ when the magnetization of fixed magnetic layer 4 beneath tunnel insulating layer 5-1 and free magnetic layer 6-1 upon tunnel insulating layer 5-1 are in the same direction, and the resistance is $R_1+6\Delta R_1$ when in opposite direction. Moreover, resistance of tunnel insulating layer 5-i in the film thickness direction is set to $R_i$ when the magnetization of free magnetic layer 6-(i−1) beneath tunnel insulating layer 5-i (i being an integer of two or greater but no greater than n) among tunnel insulating layer 5-2 through tunnel insulating layer 5-n and free magnetic layer 6-i on the upper surface of tunnel insulating layer 5-i are in the same direction, and the resistance of tunnel insulating layer 5-i is set to $R_i+\Delta R_1$ when in opposite directions.

In this case, the resistance, $R_{read}$, between bit line 2 and word line 9 becomes any one of $\{(n^2+n+2)/2\}$-number of values: $R_{const}$, $R_{const}+\Delta R/n$, $R_{const}+2\Delta R/n$, $R_{const}+3\Delta R/n$, ..., $R_{const}+\{n(n+1)/2\}\cdot\Delta R/n$. In other words, memory cell 10 is capable of storing $\{(n^2+n+2)/2\}$-number of values as data. In the magnetic memory according to the third embodiment, the number of values that can be stored in a single memory cell increments by the order of n-squared ($n^2$) for the number, n, of free magnetic layers.

It is noted that, in the magnetic memory connected in series to n-number of TMR elements shown in FIG. 14, the resistance of the tunnel insulating layer in the film thickness direction can be determined in the same way. In the following description, it is given that the resistance of tunnel insulating layer 25-i in the film thickness direction is $R_i\square$ when the magnetization of fixed magnetic layer 24-i beneath the lower surface of tunnel insulating layer 25-i and free magnetic layer 26-i on the upper surface of tunnel insulating layer 25-i are in the same direction, and the resistance is $R_i\square+\Delta R_i$ when in opposite direction. $\Delta R_1\square$, $\Delta R_2\square$, ..., and $\Delta R_n\square$ are set so that each of $\Delta R_1\square$, $\Delta R_2\square$, ..., and $\Delta R_n\square$ is different from each other, and $\Delta R_1\square$, $\Delta R_2\square$, ..., and $\Delta R_n\square$ is any of n-number of values: $\Delta R\square/n$, $2\Delta R\square/n$, $3\Delta R\square/n$, ..., $(n-1)\Delta R\square/n$, and $\Delta R\square$, respectively. This makes it possible to store $\{(n^2+n+2)/2\}$-number of values in memory cell 20 as data.

The present invention provides a magnetic memory capable of storing more data in a single memory cell.

In addition, the present invention provides a magnetic memory capable of storing high amounts of data in a single memory cell and further with simple structure.

In addition, the present invention provides a magnetic memory capable of storing high amounts of data in a single memory cell and further operates in stable manner.

What is claimed is:

1. A magnetic memory cell, comprising:
   a plurality of free magnetic layers, each of said free magnetic layers having different coercivities, the magnetization of adjacent magnetic layers of said plurality of free magnetic layers being equally likely to be in the same direction as in opposite directions; and
   a pinned magnetic layer not arranged between said free magnetic layers.

2. The cell as claimed in claim 1, wherein
   said free magnetic layers are arranged in that order on one side of said pinned magnetic layer and wherein the coercive force of each of said free magnetic layers weakens with increasing distance from said pinned magnetic layer.

3. The memory as claimed in claim 1, said memory further comprising a plurality of tunnel insulating layers, each of said plurality of tunnel insulating layers being provided between the adjacent two free magnetic layers.

4. A magnetic memory comprising:
   a memory cell including:
   a plurality of free magnetic layers, each of the plurality of free magnetic layers having different coercivities to be capable of setting at least three values therein based on the direction of the magnetization of each of the plurality of free magnetic layers, and
   a pinned magnetic layer not arranged between the plurality of free magnetic layers; and
   a plurality of conductive layers arranged to sandwich said memory cell and access said memory cell.

5. The memory as claimed in claim 4, said memory further comprising a plurality of tunnel insulating layers, each of said plurality of tunnel insulating layers being provided between the adjacent two free magnetic layers.

6. A magnetic memory, comprising:
   first through n-th tunnel insulating layers (n being a natural number of 2 or greater); and
   first through (n+1)-th magnetic layers having a first through (n+1)-th magnetization, respectively, said first magnetic layer being a pinned magnetic layer, said second to (n+1)-th magnetic layer being a free magnetic layer, said second to (n+1)-th magnetic layer each being arranged on one side of said first magnetic layer, no pinned magnetic layer being between said free magnetic layers;
   an i-th tunnel insulating layer (i being an arbitrary integer of 1 or greater but no greater than n) of said first through n-th tunnel insulating layers being provided between the i-th magnetic layer and the (i+1)-th magnetic layer of said first through the (n+1)-th magnetic layers;
   an i-th resistance between said i-th magnetic layer and said (i+1)-th magnetic layer being $R_i$ when the i-th magnetization and said (i+1)-th magnetization at said first through (n+1)-th magnetization are in the same direction; and
   said i-th resistance being $R_1+\Delta R_1$ when said i-th magnetization and said (i+1)-th magnetization are in opposite directions; and
   at least two of said $\Delta R_1, \Delta R_2, \ldots, \Delta R_n$ being different in value.

7. The magnetic memory as claimed in claim 6, wherein:
   each of said $\Delta R_1, \Delta R_2, \ldots, \Delta R_n$ is different.

8. The magnetic memory as claimed in claim 7, wherein;
   each of said $\Delta R_1, \Delta R_2, \ldots, \Delta R_n$ is substantially equal to any one of $\Delta R, \Delta R/2, \Delta R/2^2, \Delta R/2^{n-1}$, given that $\Delta R$ is a predetermined resistance.

9. The magnetic memory as claimed in claim 8, wherein:
   the magnetic material comprising said first through n-th magnetic layers is selected so that each of said $\Delta R_1, \Delta R_2, \ldots, \Delta R_n$ is substantially equal to any of $\Delta R, \Delta R/2, \Delta R/2^2, \ldots,$ or $\Delta R/2^{n-1}$.

10. The magnetic memory as claimed in claim 8, wherein:
    the film thickness of said first through n-th tunnel insulating layer is set so that each of said $\Delta R_1, \Delta R_2, \ldots, \Delta R_n$ is substantially equal to any of $\Delta R, \Delta R/2, \Delta R/2^2, \ldots,$ or $\Delta R/2^{n-1}$.

11. The magnetic memory as claimed in claim 8, wherein:
    the film quality of said first through n-th tunnel insulating layer is set so that each of said $\Delta R_1, \Delta R_2, \ldots, \Delta R_n$ is substantially equal to any of $\Delta R, \Delta R/2, \Delta R/2^2, \ldots,$ or $\Delta R/2^{n-1}$.

12. The magnetic memory as claimed in claim 8, wherein:
    the area where said i-th tunnel insulating layer (i being an arbitrary integer of 1 or greater but no greater than n) in contact with said i-th magnetic layer and the area where said i-th tunnel insulating layer in contact with said (i+1)-th magnetic layer are set so that each of said $\Delta R_1, \Delta R_2, \ldots, \Delta R_n$ is substantially equal to any of $\Delta R, \Delta R/2, \Delta R/2^2, \ldots,$ or $\Delta R/2^{n-1}$.

13. The magnetic memory as claimed in claim 8, wherein:
    the insulating material comprising said first through n-th tunnel insulating layer is set so that each of said $\Delta R_1, \Delta R_2, \ldots, \Delta R_n$ is substantially equal to any of $\Delta R, \Delta R/2, \Delta R/2^2, \ldots,$ or $\Delta R/2^{n-1}$.

14. The magnetic memory as claimed in claim 7, wherein:
    each of said $\Delta R_1, \Delta R_2, \ldots, \Delta R_n$ is substantially equal to any of $\Delta R/n, 2\Delta R/n, 3\Delta R/n, \ldots, (n-1) \Delta R/n,$ or $\Delta R$, given that $\Delta R$ is a predetermined resistance.

15. The magnetic memory as claimed in claim 22, wherein the sum of any progression generated from elements of the group consisting of, $\Delta R_1, \Delta R_2, \ldots, \Delta R_n$ is different from each other.

16. The magnetic memory as claimed in claim 6, wherein:
    the direction of said first magnetization is pinned.

17. A magnetic memory, comprising:
    a memory cell including a first magnetic layer, a second magnetic layer and a third magnetic layer, the first, second, and third magnetic layers including a plurality of free magnetic layers, the memory cell being capable of storing at least three values;
    wherein:
    the resistance between said first magnetic layer and said second magnetic layer of when magnetization of said first magnetic layer and magnetization of said second magnetic layer are in opposite directions is different from the resistance between said second magnetic layer and said third magnetic layer of when magnetization of said second magnetic layer and magnetization of said third magnetic layer are in opposite directions, the magnetization of said second magnetic layer and the magnetization of said third magnetic layer being equally likely to be in the same direction as in opposite directions.

18. The magnetic memory as claimed in claim 17, wherein:
    the respective materials of said first to third magnetic layers are different from each other.

19. The magnetic memory as claimed in claim 17, wherein:
    the respective film thickness of said first to third magnetic layers are different from each other.

20. The memory as claimed in claim 17, wherein
said second and third magnetic layers are arranged on one side of said first magnetic layer.

21. The memory as claimed in claim 20, wherein said first to third magnetic layers are arranged in that order, a coercive force of said second magnetic layer being larger than that of said third magnetic layer.

22. A magnetic memory, comprising:

a memory cell including at least a first magnetic layer, a second magnetic layer and a third magnetic, a first non-magnetic layer formed between said first and second magnetic layers, and a second, non-magnetic layer formed between said second and third magnetic layers, a current being able to flow from said first magnetic layer to said third magnetic layer through said first and second non-magnetic layers and said second magnetic layers, volume of said current being controlled by resistance between adjacent magnetic layers, the resistance being changeable by individual direction of the magnetization of said first to third magnetic layers, the resistance corresponding to data to be read out from said memory cell;

wherein:

the difference of resistance when the direction of the magnetization of said first magnetic layer and the magnetization of said second magnetic layer are reversed from being in the same direction to being in opposite directions is different from the difference of resistance between said second magnetic layer and said third magnetic layer when the magnetization of said second magnetic layer and the magnetization of said third magnetic layer are reversed from being in the same direction to being in opposite directions, the magnetization of said second magnetic layer and the magnetization of said third magnetic layer being equally likely to be in the same direction as in opposite directions.

23. The magnetic memory as claimed in claim 22, wherein:

the respective film thickness of said first and second non-magnetic layers are different from each other.

24. The magnetic memory as claimed in claim 22, wherein:

the respective areas of said first non-magnetic layers are different from each other.

25. The magnetic memory as claimed in claim 22, wherein:

respective methods of forming said first and second non-magnetic layers are different from each other.

26. The memory as claimed in claim 22, wherein
said second and third magnetic layers are arranged on one side of said first magnetic layer.

27. The memory as claimed in claim 26, wherein said first to third magnetic layers are arranged in that order, a coercive force of said second magnetic layer being larger than that of said third magnetic layer.

28. The memory as claimed in claim 22, wherein each of said first and second non-magnetic layers is a tunnel insulating film.

* * * * *